United States Patent
Gao et al.

(10) Patent No.: US 7,191,122 B1
(45) Date of Patent: Mar. 13, 2007

(54) SPEECH COMPRESSION SYSTEM AND METHOD

(75) Inventors: Yang Gao, Mission Viejo, CA (US); Adil Benyassine, Irvine, CA (US); Jes Thyssen, Laguna Niguel, CA (US); Eyal Shlomot, Long beach, CA (US); Huan-yu Su, San Clemente, CA (US)

(73) Assignee: Mindspeed Technologies, Inc., Newport Beach, CA (US)

( * ) Notice: Subject to any disclaimer, the term of this patent is extended or adjusted under 35 U.S.C. 154(b) by 47 days.

(21) Appl. No.: 11/112,394

(22) Filed: Apr. 22, 2005

Related U.S. Application Data

(63) Continuation of application No. 09/663,662, filed on Sep. 15, 2000, now Pat. No. 6,959,274, which is a continuation-in-part of application No. 09/574,396, filed on May 19, 2000, now Pat. No. 6,782,360.

(60) Provisional application No. 60/155,321, filed on Sep. 22, 1999.

(51) Int. Cl.
   *G10L 19/12* (2006.01)
(52) U.S. Cl. .................. 704/223; 704/233
(58) Field of Classification Search ........... 704/223, 704/233, 230
   See application file for complete search history.

(56) References Cited

U.S. PATENT DOCUMENTS

| | | | | |
|---|---|---|---|---|
| 5,307,441 A | * | 4/1994 | Tzeng | 704/222 |
| 5,414,796 A | * | 5/1995 | Jacobs et al. | 704/221 |
| 5,596,676 A | * | 1/1997 | Swaminathan et al. | 704/208 |
| 5,602,961 A | * | 2/1997 | Kolesnik et al. | 704/223 |
| 5,651,091 A | * | 7/1997 | Chen | 704/223 |
| 5,701,392 A | * | 12/1997 | Adoul et al. | 704/219 |
| 5,717,823 A | * | 2/1998 | Kleijn | 704/220 |
| 5,924,061 A | * | 7/1999 | Shoham | 704/218 |
| 5,995,923 A | * | 11/1999 | Mermelstein et al. | 704/219 |
| 6,810,377 B1 | * | 10/2004 | Ho et al. | 704/208 |
| 6,826,527 B1 | * | 11/2004 | Unno | 704/223 |
| 7,047,188 B2 | * | 5/2006 | Jasiuk et al. | 704/220 |

\* cited by examiner

*Primary Examiner*—Richemond Dorvil
*Assistant Examiner*—Michael N Opsasnick
(74) *Attorney, Agent, or Firm*—Farjami & Farjami LLP

(57) ABSTRACT

The invention improves the encoding and decoding of speech by focusing the encoding on the perceptually important characteristics of speech. The system analyzes selected features of an input speech signal, and first performing a common frame based speech coding of an input speech signal. The system then performs a speech coding based on either a first speech coding mode or a second speech coding mode. The selection of a mode is based on characteristics of the input speech signal. The first speech coding mode uses a first framing structure and the second speech coding mode uses a second framing structure.

16 Claims, 7 Drawing Sheets

SPEECH COMPRESSION SYSTEM AND METHOD

CROSS REFERENCE TO RELATED APPLICATIONS

This application is a continuation of U.S. patent application Ser. No. 09/663,662, filed Sep. 15, 2000, now U.S. Pat. No. 6,959,274, which claims the benefit under 35 U.S.C. §119(e) to U.S. Provisional Patent Application Ser. No. 60/155,321, filed Sep. 22, 1999; and is a continuation-in-part of U.S. patent application Ser. No. 09/574,396, filed May 19, 2000, and is now U.S. Pat. No. 6,782,360, which are incorporated by reference in their entirety.

The following commonly assigned U.S. patents and co-pending and commonly assigned U.S. patent applications further describe other aspects of the embodiments disclosed in this application and are incorporated by reference in their entirety.

U.S. Pat. No. 5,689,615, "USAGE OF VOICE ACTIVITY DETECTION FOR EFFICIENT CODING OF SPEECH," issued Nov. 18, 1997.

U.S. Pat. No. 5,774,839, "DELAYED DECISION SWITCHED PREDICTION MULTI-STATE LSF VECTOR QUANTIZATION," issued Jun. 30, 1998.

U.S. Pat. No. 6,104,992, "ADAPTIVE GAIN REDUCTION TO PRODUCE FIXED CODEBOOK TARGET SIGNAL, " issued Aug. 15, 2000.

U.S. patent application Ser. No. 09/156,649, "COMB CODEBOOK STRUCTURE," filed Sep. 18, 1998, and is now U.S. Pat. No. 6,330,531.

U.S. patent application Ser. No. 09/365,444, "BI-DIRECTIONAL PITCH ENHANCEMENT IN SPEECH CODING SYSTEMS," filed Aug. 2, 1999, and is now U.S. Pat. No. 6,704,701.

U.S. patent application Ser. No. 09/156,814, "COMPLETED FIXED CODEBOOK FOR SPEECH ENCODER," filed Sep. 18, 1998, and is now U.S. Pat. No. 6,173,257.

U.S. patent application Ser. No. 09/761,033, "SYSTEM FOR AN ADAPTIVE EXCITATION PATTERN FOR SPEECH CODING," filed on Sep. 15, 2000.

U.S. patent application Ser. No. 09/154,660 "SPEECH ENCODER ADAPTIVELY PITCH PREPROCESSING WITH CONTINUOUS WARPING," filed Sep. 18, 1998, and is now U.S. Pat. No. 6,330,533.

U.S. patent application Ser. No. 09/154,662, "SPEECH CLASSIFICATION AND PARAMETER WEIGHTING USED IN CODEBOOK SEARCH," filed Sep. 18, 1998, and is now U.S. Pat. No. 6,493,665.

U.S. patent application Ser. No. 09/154,675, "SPEECH ENCODER USING CONTINUOUS WARPING IN LONG TERM PREPROCESSING," filed Sep. 18, 1998, and is now U.S. Pat. No. 6,449,590.

U.S. patent application Ser. No. 09/154,654, "PITCH DETERMINATION USING SPEECH CLASSIFICATION AND PRIOR PITCH ESTIMATION," filed Sep. 18, 1998, and is now U.S. Pat. No. 6,507,814.

U.S. patent application Ser. No. 09/156,650, "SPEECH ENCODER USING GAIN NORMALIZATION THAT COMBINES OPEN AND CLOSED LOOP GAINS," filed Sep. 18, 1998, and is now U.S. Pat. No. 6,260,010.

U.S. patent application Ser. No. 09/154,657, "SPEECH ENCODER USING A CLASSIFIER FOR SMOOTHING NOISE CODING," filed Sep. 18, 1998, now abandoned.

U.S. patent application Ser. No. 09/640,841, "METHOD FOR SPEECH CODING USING SNR," filed Aug. 16, 2000, now U.S. Pat. No. 6,898,566.

U.S. patent application Ser. No. 09/643,017, "METHOD FOR ROBUST CLASSIFICATION IN SPEECH CODING," filed Aug. 21, 2000, now U.S. Pat. No. 6,983,242.

U.S. patent application Ser. No. 09/156,648, "LOW COMPLEXITY RANDOM CODEBOOK STRUCTURE," filed Sep. 18, 1998, and is now U.S. Pat. No. 6,480,822.

U.S. patent application Ser. No. 09/156,416, "METHOD AND APPARATUS FOR DETECTING VOICE ACTIVITY AND SILENCE IN A SPEECH SIGNAL USING PITCH LAG AND PITCH GAIN STATISTICS," filed Sep. 18, 1998, and is now U.S. Pat. No. 6,188,981.

U.S. patent application Ser. No. 09/154,653, "SYNCHRONIZED ENCODER-DECODER FRAME CONCEALMENT USING SPEECH CODING PARAMETERS," filed Sep. 18, 1998, and is now U.S. Pat. No. 6,188,980.

U.S. patent application Ser. No. 09/156,826, "Adaptive Tilt Compensation For Synthesized Speech Residual," filed Sep. 18, 1998, and is now U.S. Pat. No. 6,385,573.

BACKGROUND OF THE INVENTION

1. Field of the Invention

The present invention relates to speech coding, and more particularly, to speech coding systems that operate at a bit rate of 4 kbits/s.

2. Related Art

Speech coding systems may not operate effectively at low bit rates. When a small bandwidth is available to encode speech, the perceptual quality of encoded speech declines dramatically. Because of the increase use of wireless communication, there is an effort to reduce the bandwidth upon which such wireless communication systems operate.

To efficiently decrease the wireless bandwidth but still retain a toll quality, a speech coding system generally performs a strict waveform matching. Waveform matching as employed in a low bit rate wireless coding system, such as 4 kbits/s, however, may not perceptually or accurately capture the speech information. Therefore, there is a need in the art for a system that provides a speech coding system with a high perceptual quality at a low bit rate.

SUMMARY

The invention is a system that improves the equality of encoding and decoding by focusing on the perceptually important characteristics of speech. The system analyzes features of an input speech signal and performs a common frame based speech coding of an input speech signal. The system then performs a speech coding based on either a first speech coding mode or a second speech coding mode. The selection of a mode is based on at least one feature of the input speech signal. The first speech coding mode uses a first framing structure and the second speech coding mode uses a second framing structure.

The system may operate at approximately 4 kbits/s. The first framing structure and the second framing structure both use eighty bits. In this system eighty bits, are transmitted from an encoder to a decoder. The decoder receives the bits from the encoder and reconstructs the speech using the decoder. Twenty-one bits are allocated to code the linear prediction coefficients. One bit is allocated to the speech coding mode. Fourteen bits are allocated for an adaptive codebook for the first framing structure and seven bits are allocated to the second framing structure for the adaptive codebook for the second framing structure. In the first framing structure, thirty bits are used to code a first fixed codebook. In the second framing structure, thirty-nine bits are used to code a first fixed codebook.

The first speech coding mode uses a two dimensional vector quantization gain codebook and a two dimensional code-vector. The two dimensional code-vector is selected from the two dimensional vector quantization gain codebook that has an adaptive codebook gain and a fixed codebook gain. Fourteen bits are allocated to the vector quantization gain codebook.

The second speech coding mode uses two three dimensional vector quantization gain codebooks. A first three dimensional code-vector is selected from a first three dimensional vector quantization gain codebook that has an adaptive codebook gain. A second three dimensional code-vector is selected from a second three dimensional vector quantization gain codebook that has a fixed codebook gain. Four bits are allocated to the first three dimensional vector quantization gain codebook. Eight bits are allocated to the second three dimensional vector quantization gain codebook. The first speech coding mode and the second speech coding mode operate at the same bit rate.

In another aspect, the system dynamically decodes an encoded speech signal by selecting between a first speech decoding mode and a second speech decoding mode according to the mode bit transmitted from the encoder to the decoder. Many characteristics of the input signal may be used to make this selection. The characteristics can include the degree of noise-like content in the input speech signal, the degree of spike content in the input speech signal, the degree of voiced content in the input speech signal, the degree of unvoiced content in the input speech signal, the change in the magnitude spectrum of the input speech signal, the change of the energy contour of the input speech signal, and the level of periodicity in the input speech signal.

Another aspect of the invention analyzes an input signal by dynamically selecting between a first speech coding mode and a second speech coding mode based on select features of the input signal. The system codes a first frame of the input speech signal using the first speech coding mode and codes a second frame of the input speech signal using the second speech coding mode. The number of bits allocated to the first speech coding mode may be based on the parameters used to code the input speech signal just as the number of bits allocated to the second speech coding mode may be based on the number of parameters used to code the input speech signal. A total number of bits used for each speech coding mode can also be the same.

In another aspect of the invention, the extended code excited linear prediction speech coding system operates at approximately 4 kbits/s. The number of bits used for the speech coding modes is eighty bits. The first speech coding mode uses a first framing structure and the second speech coding mode uses a second framing structure. The first framing structure codes a first fixed codebook using thirty bits and the second framing structure codes a second fixed codebook using thirty-nine bits. The second framing structure codes the adaptive codebook gains using four bits and codes the fixed codebook gains using eight bits. The system performs dynamic gain quantization in the first speech coding mode and the second speech coding mode, respectively.

Another aspect of the invention analyzes an input signal by its features, performs a common frame based speech coding, and also performs a mode dependent speech coding using either a first speech coding mode or a second speech coding mode. In this aspect, at least one of the features of the input signal is a substantially non-periodic-like characteristic, and at least one of the of the other features of the input signal is a substantially periodic-like characteristic.

In yet another aspect of the invention, the system uses a two dimensional vector quantization gain codebook and a two dimensional code-vector at approximately 4 kbits/s. The two dimensional code-vector is selected from the two dimensional vector quantization gain codebook that has an adaptive codebook gain and a fixed codebook gain. The second speech coding mode uses a first three dimensional vector quantization gain codebook and a second three dimensional vector quantization gain codebook. A first three dimensional code-vector selected from the first three dimensional vector quantization gain codebook has an adaptive codebook gain. The second three dimensional code-vector selected from the second three dimensional vector quantization gain codebook has a fixed codebook gain. The system decodes the encoded speech signal and dynamically selects a speech coding mode according to the system that decodes of the speech signal. The system determines whether a received frame of the encoded speech signal is defective, and performs a frame erasure when a defective received frame is detected.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principles of the invention. Moreover, in the figures, like reference numerals designate corresponding parts throughout the different views.

DETAILED DESCRIPTION

Figure 1:
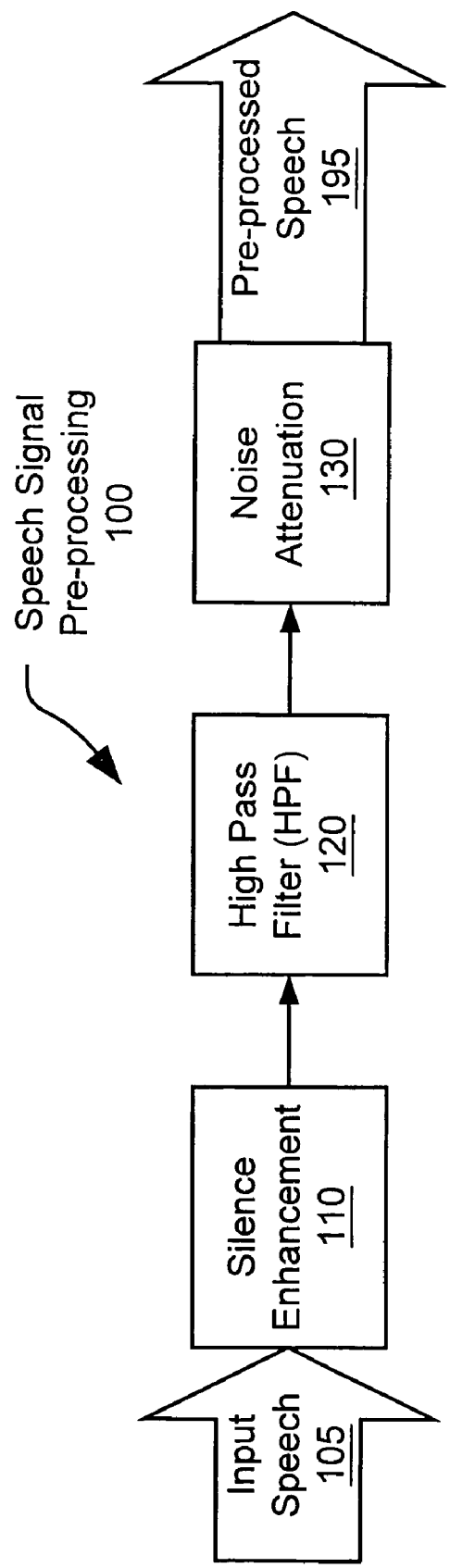
FIG. 1 is a system diagram of a speech coding system performing signal pre-processing.

The system employs an eXtended Code Excited Linear Prediction System (eXtended CELP) that is based on a Code Excited Linear Prediction System (CELPS) that performs speech coding. To achieve toll quality at a low bit rate, such as 4 kbits/s, the system puts emphasis on the perceptually important features of an input speech signal during the encoding process. This occurs by analyzing certain features of the input speech signal, such as the degree of noise-like content, the degree of spike-like content, the degree of voiced content, the degree of unvoiced content, the change in the magnitude spectrum, the change in the energy contour, and the level of periodicity, for example. The system uses this information to control a weighting during an encoding/quantization process. The system represents accurately the perceptually important features of a speech signal, while allowing errors in the perceptually less important features. This is based on the observation that 4 k bits/s is not sufficient to accurately represent the waveform of the input signal. In some sense, the system has to prioritize. For example, for a random-like signal, the system disregards the accuracy in the waveform matching to some extent and encourages the selection of the fixed codebook excitation form a Gaussian codebook. The system modifies the waveform of the input signal while leaving it perceptually indistinguishable in order to allow the model to more accurately represent the input signal.

The system operates on a frame size of approximately 20 ms (or about 160 samples) using either two or three subframes. The number of subframes is controlled by a mode selection. Mode zero ("0") uses two subframes and Mode one ("1") uses three subframes. For a Mode 0 the subframe size is approximately 10 ms (or about 80 samples), and in a Mode 1 the first and the second subframes are approximately 6.625 ms (or about 53 samples) and the third subframe is approximately 6.75 ms (or about 54 samples). In both Mode 1 and Mode 0, a look-ahead of approximately 15 ms is used. The one-way coding delay of the system adds up to approximately 55 ms according to the delay definition in the terms of reference.

For both Mode 0 and Mode 1, a $10^{th}$ order LP (Linear Prediction) model is used to represent the spectral envelope of the signal. The $10^{th}$ order LT model is coded in the LSF (Line Spectrum Frequency) domain using a 21 bit delayed decision switched multi-stage predictive vector quantization scheme. One bit specifies one of two MA (Moving Average) predictors, and three stages (each with a 10 dimensional codebook) of 7 bits, 7 bits, and 6 bits, respectively, are used to represent the prediction error.

Preferably, Mode 0 processes "non-periodic" frames. Examples of non-periodic frames may include transition frames where the typical parameters such as pitch correlation and pitch lag change rapidly or frames where the signal is dominantly noise-like. Mode 0 uses two subframes and codes the pitch lag once per subframe, and has a 2-dimensional vector quantizer of 7 bits that jointly codes the pitch gain and the fixed codebook gain once per subframe. Preferably, the fixed codebook includes at least three sub-codebooks, where two of the fixed sub-codebooks are pulse codebooks and the third sub-codebook is a Gaussian sub-codebook. In this embodiment, the pulse codebooks are a two-pulse sub-codebook and a three-pulse sub-codebook. Preferably, the Gaussian sub-codebook has two orthogonal basis vectors each having a dimension of 40, which lowers the complexity of the Gaussian sub-codebook search. The number of entries in the sub-codebooks may be $2^{14}$, $2^{13}$, and $2^{13}$, respectively. Accordingly, 15 bits may be allocated to the fixed codebook in Mode 0.

Preferably, Mode 1 processes "periodic" frames. Highly periodic frames can be perceptually well represented with a smooth pitch track. In Mode 1, a frame can be broken into three subframes. The pitch lag is coded once per frame prior to a subframe processing, which is part of the pitch pre-processing. An interpolated pitch track is derived from the pitch lag. In Mode 1, three pitch gains (one from each subframe) exhibit a very stable behavior and can be jointly quantized using vector quantization in an open-loop MSE fashion using 4 bits prior to a subframe processing. The three reference pitch gains, which are unquantized pitch gains, are derived from the weighted speech and are a product of the frame based pitch pre-processing. Using pre-quantized pitch gains, the traditional CELP subframe processing is performed while the three fixed codebook gains are left unquantized. The three fixed codebook gains are jointly quantized with an 8 bits vector quantizer after subframe processing (a delayed decision) using a moving average (MA) prediction of the energy. Thereafter, the three subframes are synthesized with fully quantized parameters to update filter memories. During a traditional CELP subframe process, the fixed codebook excitation is quantized with 13 bits per subframe. The codebook has three pulse sub-codebooks with $2^{12}$, $2^{11}$, and $2^{11}$ entries, respectively, and the number of pulses in the sub-codebooks are 2, 3, and 6, respectively.

The parameters of the system are represented by 80 bits per frame resulting in a bit-rate of 4 kbits/s. An overview of the bit-allocation is shown in Table. 1.

TABLE 1

Detailed bit-allocation.

| Parameter | Bits per 20 ms Mode 0 (2 subframes) | | Mode 1 (3 subframes) | |
|---|---|---|---|---|
| LSFs | Predictor switch | | 1 bit | |
| | $1^{st}$ stage | | 7 bits | |
| | $2^{nd}$ stage | | 7 bits | |
| | $3^{rd}$ stage | | 6 bits | |
| | | | 21 bits | |
| Mode | 1 bit | | | |
| Adaptive codebook | 7 bits/ subframe | 14 bits | 7 bits/ frame | 7 bits |
| Fixed codebook | 2-pulse codebook | 16384/subframe | 2-pulse codebook | 4096/subframe |
| | 3-pulse codebook | 8192/subframe | 3-pulse codebook | 2048/subframe |
| | Gaussian codebook | 8192/subframe | 6-pulse codebook | 2048/subframe |
| | | 32768/subframe | | 8192/subframe |
| | 15 bits/ subframe | 30 bits | 13 bits/ subframe | 39 bits |
| Adaptive codebook gain | 2D VQ/ subframe | 7 bits/subframe | 3D preVQ/ frame | 4 bits |
| Fixed codebook gain | | 14 bits | 3D delayed VQ/frame | 8 bits |
| TOTAL | | 80 bits | | 80 bits |

The 80 bits per frame of Table 1 are transmitted from an encoder to a decoder. Preferably, the decoder maps the 80 bits back to the parameters of the encoder. A synthesis of a speech signal from these parameters is similar to the ITU-Recommendation G.729 main body. The post-filter has a long-term (pitch) and a short-term (LPC) post-processing.

1. Encoder System.

Figure 3:
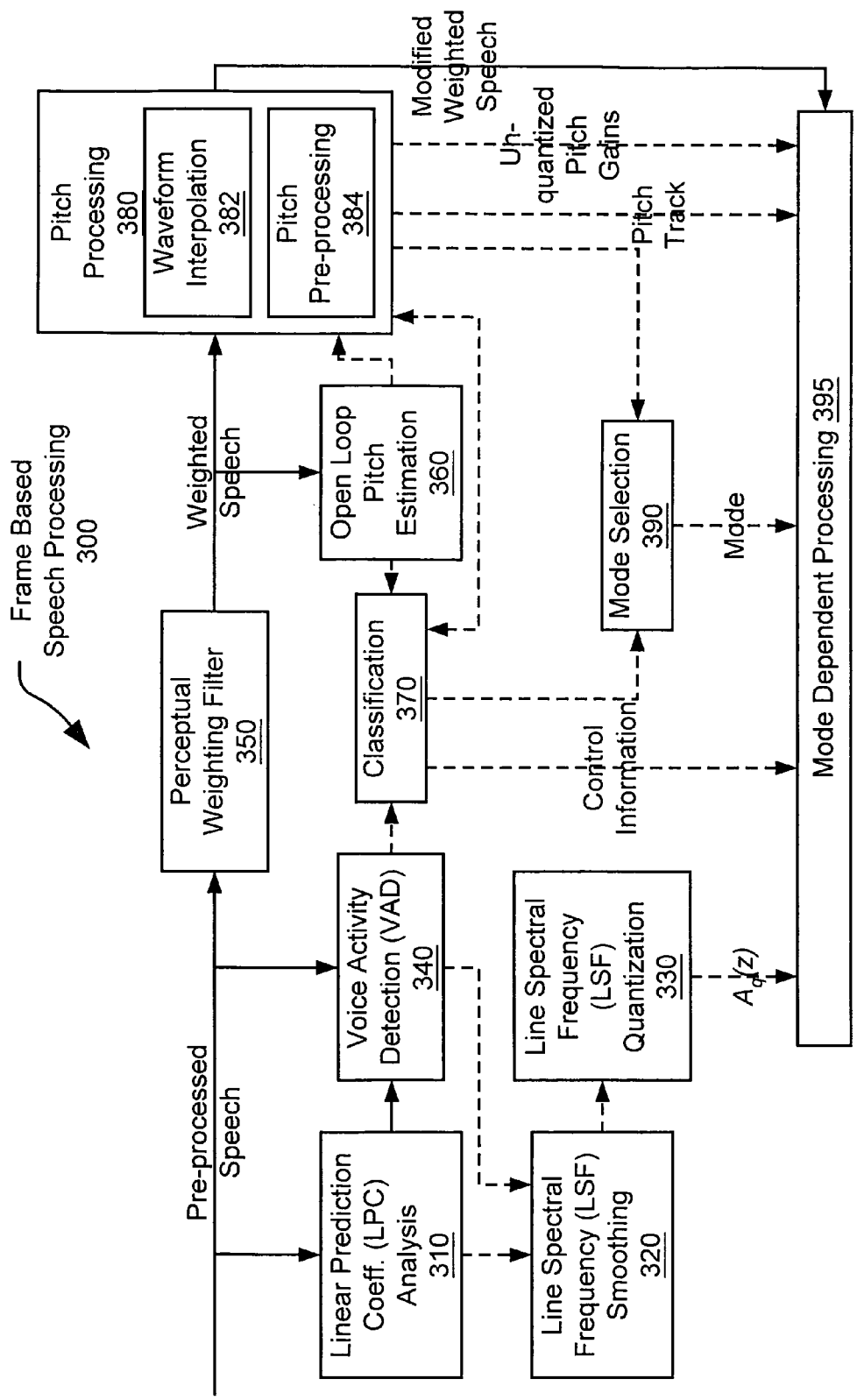
FIG. 3 is a block diagram of a common frame based system.

FIGS. 1 and 3 illustrate the frame based processing stages that are used in Mode 0 and Mode 1. The pre-processing stages that condition the speech signal prior to encoding are shown in FIG. 1 and the common frame based encoding is shown in FIG. 3. The processing functions dedicated to Mode 0 and Mode 1, respectively, are shown in the FIGS. 4 and 6, respectively.

FIG. 1 shows the pre-processing of a speech signal prior to the actual speech encoding. The pre-processing circuit includes a silence enhancement circuit or function 110, a high-pass filter 120, and a background noise attenuation circuit or function 130. After an input signal 100 is received, a silence enhancement 110 function occurs. The enhanced signal is then filtered by a high pass filter (HPF) 120 and conditioned by a noise attenuation circuit 130 that generates a pre-processed speech signal 195.

A. Silence Enhancement Function.

After reading and buffering speech samples for a given frame, a speech segment is analyzed to detect the presence of pure silence, i.e., "silence noise." This function adaptively tracks a minimum resolution and the levels of the signal near zero. According to this analysis, the function adaptively detects on a frame-by-frame basis whether the current frame is silence and only contains "silence-noise." If a "silence noise" is detected, the silence enhancement 110 ramps the input signal to the zero-level of the speech input signal. The zero-level of the input speech signal 105 depends on the prior processing of the speech coding method. For A-law, the zero-level is 8, while for µ-law and 16 bit linear PCM (Pulse Code Modulation), the zero-level is 0. Preferably, the zero-level of the signal is tracked adaptively by the silence enhancement 110. It should be noted, that the silence enhancement 110 may only modify an input speech signal 105 if the sample values for the given frame are within two quantization levels of the zero-level.

The silence enhancement 110 cleans up the silence portions of clean speech for very low-level noise, and enhances the perceptual quality of that speech. The effect of the enhancement 110 becomes especially noticeable when the input originates from an A-law source, i.e., the input has passed through an A-law encoding and decoding process immediately prior to being processed by the speech coding system. The noticeable difference in the signal is due to the amplification of sample values around zero (e.g., −1, 0, +1) to either −8 and +8 that is inherent in A-law. The amplification has the potential of transforming an inaudible "silence noise" into a clearly audible noise.

B. High-Pass Filter.

The input high-pass filter 120 is similar to the an input high-pass filter of G.729. It is a $2^{nd}$ order filter having a cut-off frequency of approximately 140 Hz. The high pass filter can be expressed as:

$$H(z) = \frac{0.92727435 - 1.854491z^{-1} + 0.92727435z^{-2}}{1 - 1.9059465z^{-1} + 0.9114024z^{-2}}$$ (Equation 1)

Preferably, the input is scaled down by a factor 2 during high-pass filtering. This may be achieved by dividing the coefficients of the numerator by a factor of 2.

C. Noise Attenuation.

Figure 2:
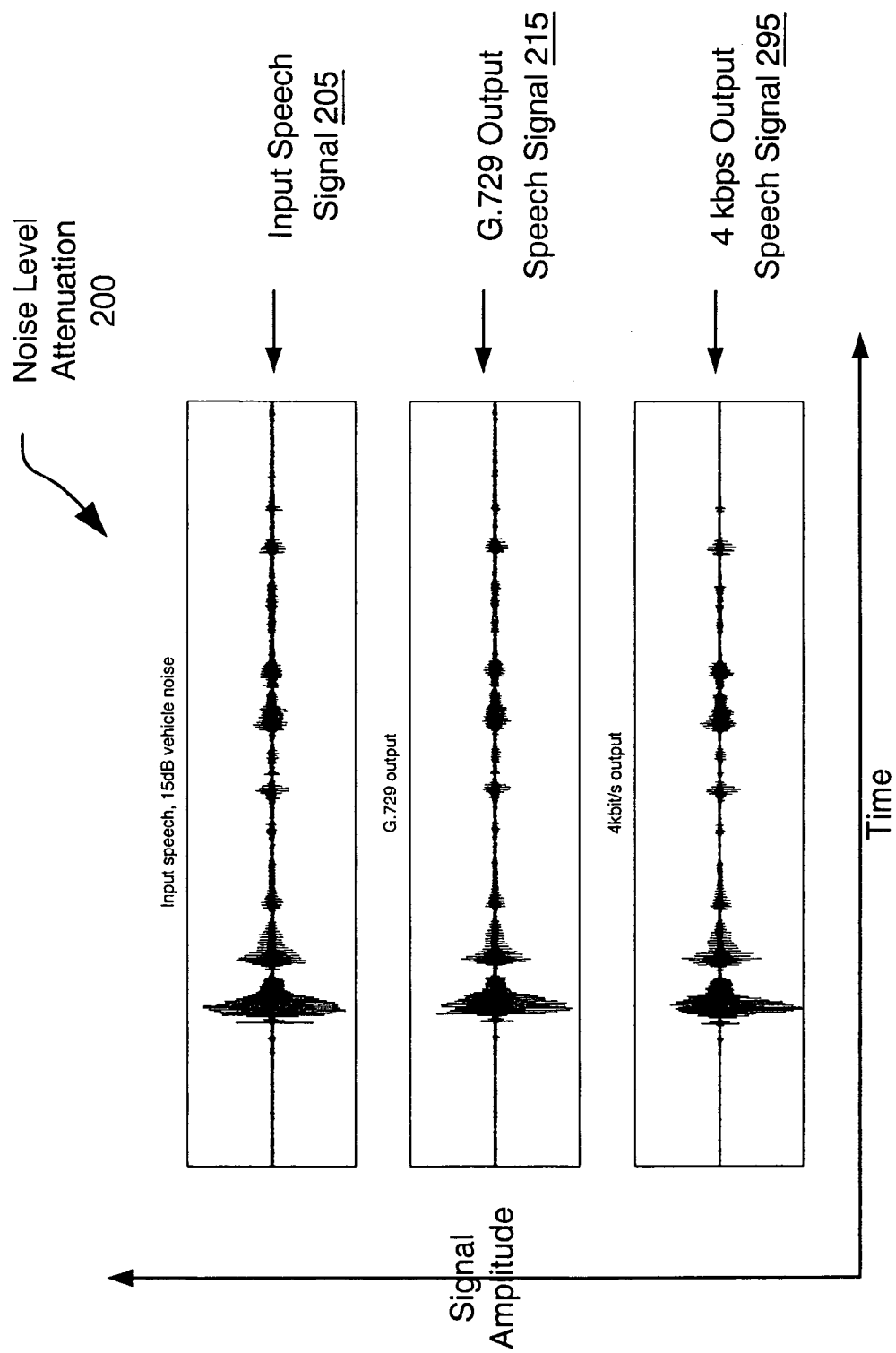
FIG. 2 is a graph of noise level attenuation by the speech coding system.

Noise attenuation 130 having a maximum attenuation of about 5 dB is performed to improve the estimation of the parameters in the system while leaving the listener with a clear sensation of the listener's environment. In FIG. 2, a speech segment in 15 dB additive vehicle noise is shown with an output from G.729 and a 4 kbits/s eX-CELP. As shown, the noise attenuation 130 of FIG. 1 incorporated in the 4 kbits/s eX-CELP system results in an input-to-output attenuation slightly higher than the inherent attenuation of noise produced by G.729. More precisely, the ITU-Recommendation G. 729 output speech signal 215 illustrates the noise level attenuation of the noise in the input speech signal 205 having the 15 dB vehicle noise and the 4 kbits/s output speech signal 295 illustrates the noise level attenuation of the noise in the input speech signal 205 having the 15 dB vehicle noise.

2. Common Frame Based Processing.

FIG. 3 is a block diagram illustrating a preferred common frame based process 300 that is performed on a pre-processed speech signal 195 prior to performing a Mode dependent processing. A pre-processed speech signal is received by a perceptual weighting filter block 350, a linear prediction coefficient (LPC) analysis block 310, and a voice activity detection (VAD) block 340. After passing through the perceptual weighting filter block 350, weighted speech is passed to a pitch processing block 380 and an open loop pitch estimation block 360. The pitch processing block 380 comprises a waveform interpolation block 382 and a pitch pre-processing block 384. A modified weighted speech signal is passed from the pitch processing block 380 to a Mode dependent processing block 395.

A linear prediction coefficient (LPC) analysis block 310 processes the pre-processed speech 195 and generates an output received by the voice activity detection (VAD) block 340 and a line spectral frequency (LSF) smoothing block 320. Similarly, the voice activity detection (VAD) block 340 also processes the pre-processed speech 195 and generates an output received by the line spectral frequency (LSF) smoothing block 320. The line spectral frequency (LSF) smoothing block 320 processes the output from the linear prediction coefficient (LPC) analysis block 310 and the voice activity detection (VAD) block 340 and generates an output received by a line spectral frequency (LSF) quantization block 330. The line spectral frequency (LSF) quantization block 330 generates an output, $A_q(Z)$, received by the mode dependent processing block 395.

The voice activity detection (VAD) block 340 also provides an output to a classification block 370 that generates control information received by the mode dependent processing block 395 and a mode selection block 390. The weighted speech generated by the perceptual weighting filter block 350 is received by the classification block 370 and the pitch processing block 380 after being processed by the open loop pitch estimation block 360. The pitch processing block 380 and the classification block 370 are also communicatively coupled. The pitch processing block 380 and the classification block 370 generate output received by a mode selection block 390. The pitch processing block 380 provides pitch track information and unquantized pitch gains to the mode dependent processing block 395.

A. LPC Analysis.

Preferably, in each frame three $10^{th}$ order LPC analyses are performed. The LPC analyses are centered at a middle third, a last third, and a lookahead of a frame. The LPC analysis for the lookahead frame is recycled in the next frame as the LPC analysis centered at the first third of that frame. Consequently, four sets of LPC parameters are available at the encoder in each frame.

A symmetric Hamming window is used for the LPC analyses of the middle and last third of the frame, and an asymmetric Hamming window is used for the LPC analysis of the lookahead segment to center the weight appropriately. For each of the windowed segments, a $10^{th}$ order autocorrelation coefficients, r(k), may be calculated according to Equation 2, $$r(k) = \sum_{n=k}^{N-1} s_w(n) \cdot s_w(n-k)$$ (Equation 2)

where $s_w(n)$ is the speech signal after weighting with the proper Hamming window. A Bandwidth expansion of 60 Hz and a white noise correction factor of 1.0001, i.e., adding a noise floor of −40 dB, are applied by weighting the autocorrelation coefficients according to Equation 3, $$r_w(k) = w(k) \cdot r(k) \quad \text{(Equation 3)}$$

where the weighting function is expressed by Equation 4.

$$w(k) = \begin{cases} 1.0001 & k = 0 \\ \exp\left[-\frac{1}{2}\left(\frac{2\pi \cdot 60 \cdot k}{8000}\right)\right] & k = 1, 2, \ldots, 10 \end{cases} \quad \text{(Equation 4)}$$

Based on the weighted autocorrelation coefficients, the short-term LP filter coefficients, i.e., $$A(z) = 1 - \sum_{i=1}^{10} a_i \cdot z^{-i}, \quad \text{(Equation 5)}$$

are estimated using the Leroux-Gueguen method, and the LSF (Line Spectrum Frequency) parameters are derived from the polynomial $A(z)$. Three sets of LSF parameters can be represented as expressed in Equation 6, $$lsf_j(k), \; k=1,2\ldots,10 \quad \text{(Equation 6)}$$

where $lsf_2(k)$, $lsf_3(k)$, and $lsf_4(k)$ are the LSFs for the middle third, last third, and lookahead of the frame, respectively.

If the signal has extremely low energy, such as zero energy based on an integer truncated signal, a flat LPC spectrum is generated. This result prevents certain low level problems caused by interaction between the LPC filter and the gain quantization. It has been found that in some cases of very low level energy segments, such as practically zero energy, the LPC filters can have high gains. In this condition, the predictive gain quantizer for a fixed codebook gain generally is unable to reduce the energy level to a target level, and consequently, audible artifacts are generated. This condition is avoided by the described system. When this condition is not encountered (in case of non-zero signal), the reflection coefficients and prediction coefficients are derived and converted to the LSFs.

B. LSF Smoothing.

Before LSF quantization, the LSFs are smoothed in time to reduce unwanted fluctuations in the spectral envelope of the LPC synthesis filter. Smoothing is done during "smooth" background noise to preserve the perceptual characteristic of the background noise. The smoothing is controlled by the VAD information and analysis of the evolution of the spectral envelope. The LSF smoothing factor is denoted $\beta_{lsf}$ and is applied according to the following parameters.

1. At the beginning of "smooth" background noise segments the smoothing factor is preferably ramped quadraticly from 0.0 to 0.9 over 5 frames.
2. During "smooth" background noise segments the smoothing factor is preferably 0.9.
3. At the end of "smooth" background noise segments the smoothing factor is preferably reduced to 0.0 instantaneously.
4. During non-"smooth background noise segments" the smoothing factor is preferably 0.0.

According to the LSF smoothing factor, the LSFs for the quantization can be calculated as follows:

$$lsf_n(k) = \beta_{lsf} \cdot lsf_{n-1}(k) + (1-\beta_{lsf}) \cdot lsf_3(k), \; k=1,2,\ldots,10 \quad \text{(Equation 7)}$$

where $lsf_n(k)$ and $lsf_{n-1}(k)$ represents the smoothed LSFs of the current and previous frame, respectively, and $lsf_3(k)$ represents the LSFs of the LPC analysis centered at the last third of the current frame.

C. LSF Quantization.

The $10^{th}$ order LPC model given by the smoothed LSFs (Equation 7) is quantized in the LSF domain once per frame using 21 bits. The detailed bit-allocation is shown in Table 1. A three stage switched MA (Moving Average) predictive vector quantization scheme is used to quantize the 10 dimensional LSF vector. The input LSF vector (unquantized vector) originates from the LPC analysis centered at the last third of the frame. The error criterion of the quantization is a WMSE (Weighted Mean Squared Error) measure, where the weighting is a function of the LPC magnitude spectrum. Accordingly, the objective of the quantization can be expressed as Equation 8, $$\{l\hat{s}f_n(1), l\hat{s}f_n(1), \ldots, l\hat{s}f_n(10)\} = \arg\min\left\{\sum_{k=1}^{10} w_i \cdot (lsf_n(k) - l\hat{s}f_n(k))^2\right\} \quad \text{(Equation 8)}$$

where the weighting is $$w_i = |P(lsf_n(i))|^{0.4} \quad \text{(Equation 9)}$$

and where $|P(f)|$ is the LPC power spectrum at frequency $f$, the index $n$ denotes the frame number. The quantized LSFs $l\hat{s}f_n(k)$ of the current frame are based on a $4^{th}$ order MA prediction and is given by Equation 10, $$\underline{l\hat{s}f}_n = \underline{l\tilde{s}f}_n + \hat{\underline{\Delta}}_n^{lsf} \quad \text{(Equation 10)}$$

where $$\underline{l\tilde{s}f}_n$$

is the predicted LFSs of the current frame (a function of $$\{\hat{\underline{\Delta}}_{n-1}^{lsf}, \hat{\underline{\Delta}}_{n-2}^{lsf}, \hat{\underline{\Delta}}_{n-3}^{lsf}, \hat{\underline{\Delta}}_{n-4}^{lsf}\},$$

and $$\hat{\underline{\Delta}}_n^{lsf}$$

is the quantized prediction error at the current frame. The prediction error is given by Equation 11.

$$\underline{\Delta}_n^{lsf} = \underline{lsf}_n = \underline{lsf}_n.$$ (Equation 11)

The prediction error from the $4^{th}$ order MA prediction is quantized with three 10 dimensional codebooks of sizes 7 bits, 7 bits, and 6 bits, respectively. The remaining bit is used to specify either of two sets of predictor coefficients, where the weaker predictor improves (reduces) error propagation during channel errors. The prediction matrix is fully populated, i.e., prediction in both the time and the frequency is applied. A closed loop delayed decision is used to select the predictor and the final entry from each stage based on a subset of candidates. The number of candidates from each stage is 10, resulting in the future consideration of 10, 10, and 1 candidates after the $1^{st}$, $2^{nd}$, and $3^{rd}$ codebook, respectively.

After reconstruction of the quantized LSF vector according to Equation 10, the ordering property is checked. If two or more pairs are flipped the LSF vector is declared erased and is reconstructed preferably using a frame erasure concealment of the decoder. This check facilitates the addition of an error check at the decoder based on the LSF ordering while maintaining bit-exactness between the encoder and the decoder during error free conditions. An encoder-decoder synchronized LSF erasure concealment improves performance during error conditions while not degrading performance in error free conditions. Although theoretically this condition may occur during speech, it was found to rarely occur. If only one pair is flipped, they are re-ordered in synchrony with the decoder. Finally, a minimum spacing of 50 Hz between adjacent LSF coefficients is enforced.

D. VAD (Voice Activity Detection).

A voice activity detection system is embedded in the encoder to provide information on the characteristic of the input signal. The VAD information is used to control several aspects of the encoder including estimation of Signal to (background) Noise Ratio (SNR), pitch estimation, classification, spectral smoothing, energy smoothing, and gain normalization. The voice activity detection system is based on the absolute maximum of a frame, reflection coefficients, prediction error, an LSF vector, the $10^{th}$ order autocorrelation, recent pitch lags, and recent pitch gains. The LPC related parameters originate from the LPC analysis centered at the last third of the frame. The pitch related parameters are delayed by one frame since pitch lags and gains of the current frame are not yet available.

E. Perceptual Weighting Filter.

The perceptual weighting filter is comprised of two filters. The first filter is derived from the unquantized LPC filter given by:

$$w_1(z) = \frac{A\left(\frac{z}{\gamma_1}\right)}{A\left(\frac{z}{\gamma_2}\right)},$$ (Equation 12)

where $\gamma_1=0.9$ and $\gamma_2=0.55$. The second filter is an adaptive low-pass filter given by:

$$w_2(z) = \frac{1}{1-\eta z^{-1}},$$ (Equation 13)

where $\eta$ is a function of the tilt of the spectrum, i.e., the first reflection coefficient of the LPC analysis. The second filter, which is a weighting filter is used only for the open loop pitch estimation, waveform interpolation and pitch pre-processing. For the adaptive and fixed codebook searches, gain quantization, etc., only the first filter (i.e., first weighting filter) is applied.

F. Open Loop Pitch Estimation.

For every frame, the open loop pitch lag has to be estimated for the first half and the second half of the frame. The Mode 0 uses the two open loop pitch lags for the search of the adaptive codebook for the first and second subframe, respectively. Mode 1 uses the open loop pitch lag for the second half of the frame as basis for the interpolated pitch track for the pitch pre-processing. The open loop pitch lag for the first half of the frame is not used for Mode 1.

The open loop pitch estimation is based on the weighted speech given by Equation 14, $$S_w(z)=S(z) \cdot W_1(z)W_2(z)$$ (Equation 14)

where S(z) is the pre-processed speech signal. The pitch lag preferably ranges from 17 to 127 samples.

Two open loop pitch lags and pitch correlation coefficients are estimated per frame. The first set is centered at the second half of the frame, and the second set is centered at the lookahead of the frame. The set centered at the lookahead is reused during the next frame as the set centered at the first half of the frame. Consequently at every frame, three sets of pitch lag and pitch correlation coefficient are available at the encoder at the computational expense of two sets.

Each of the two sets is calculated according to the following steps. First, the normalized correlation function is calculated as given by:

$$R(k) = \frac{\sum_{n=0}^{L} s_w(n) \cdot s_w(n-k)}{E},$$ (Equation 15)

where L=80 is the window size, and E, which is the energy of the segment, is expressed as:

$$E = \sum_{n=0}^{L} s_w(n)^2$$ (Equation 16)

The maximum of the normalized correlation R(k) in each of three regions [17,33], [34,67], and [68,127] are then determined. This results in three candidates for the pitch lag. An initial best candidate from the three candidates is selected based on the normalized correlation, classification information, and the history of the pitch lag. Once the initial best lag for the second half of the frame and the lookahead is available, the initial estimates for the lag at the first half, the second half of the frame, and the lookahead are ready. A final adjustment of the estimates of the lag for the first and second half of the frame is calculated based on the context of the respective lags with regards to the overall pitch contour, e.g., for the pitch lag for the second half of the frame, information on the pitch lag in the past and the future (the lookahead) is available.

G. Classification.

The eX-CELP method makes use of classification in many modules to emphasize the perceptually important features during encoding. The three main frame based classifications are detection of unvoiced noise-like speech, a six grade signal characteristic classification, and a six grade classification to control the pitch pre-processing.

3. Detection of Unvoiced Noise-Like Speech.

The detection of unvoiced noise-like speech is used for several purposes. One main purpose being generating the noise-like speech class in the Signal Characteristic Classification, and controlling the pitch pre-processing. The detection is based on the weighted residual signal given by Equation 17 and the pre-processed speech signal.

$$R_w(Z) = A\left(\frac{z}{\gamma_1}\right) \cdot S(z) \quad \text{(Equation 17)}$$

From the input signals, the residual sharpness, first reflection coefficient, zero crossing rate, and the prediction factor are calculated and used by the decision logic. Residual sharpness can be expressed as Equation 18, $$\phi = \frac{\frac{1}{L}\sum_{n=0}^{L-1}|r_w(n)|}{\max\{|r_w(n)|, n=0,1,\ldots,L-1\}}, \quad \text{(Equation 18)}$$

where $r_w(n)$ is the weighted residual signal and L=160 is the frame size. First reflection coefficient (tilt of the magnitude spectrum) of the pre-processed speech signal can be expressed as Equation 19, $$\varphi = \frac{\sum_{n=1}^{L-1} s(n) \cdot s(n-1)}{\sum_{n=0}^{L-1} s(n)^2}, \quad \text{(Equation 19)}$$

where $s(n)$ is the pre-processed speech signal and L=160 is the frame size. Zero crossing rate of the pre-processed speech signal can be expressed as Equation 20 and $$\gamma = \frac{1}{L-1}\sum_{n=1}^{L-1}\{s(n) \cdot s(n-1) < 0 ? 1\}. \quad \text{(Equation 20)}$$

prediction factor can be expressed as Equation 21.

$$\eta = 1 - \sqrt{\frac{\sum_{n=0}^{L-1} r_w(n)^2}{\sum_{n=0}^{L-1} s(n)^2}} \quad \text{(Equation 21)}$$

The detection of noise-like unvoiced speech is performed in the 4 dimensional space spanned by ($\phi$, $\varphi$, $\gamma$, $\eta$) by comparison to fixed decision boundaries.

4. Signal Characteristic Classification.

The eX-CELP system classifies frames into one of six classes according to a dominant features of that frame. The frame may be classified according to:
  0. Silence/Background Noise;
  1. Noise-Like Unvoiced Speech;
  2. Unvoiced;
  3. Onset;
  4. Plosive, (which is not used);
  5. Non-Stationary Voiced; and
  6. Stationary Voiced.

Currently, class 4 is not used. To more effectively use information available in the encoder, the central module for the classification does not initially distinguish classes 5 and 6. This distinction is instead done during the pitch pre-processing where additional information is available. Furthermore, the central module does not initially detect class 1. This class is also introduced during the pitch pre-processing based on additional information and the detection of noise-like unvoiced speech. Hence, the central module distinguishes between silence/background noise, unvoiced speech, onset, and voiced speech using the class number 0, 2, 3, and 5, respectively.

The central signal classification module receives the pre-processed speech signal, the pitch lag and correlation of the second half of the frame, and the VAD information. Based on these parameters, the module initially derives the spectral tilt, the reflection coefficient, and the pitch correlation. The spectral tilt (estimation of first reflection coefficient 4 times per frame) can be calculated by Equation 22, $$\kappa(k) = \frac{\sum_{n=1}^{L-1} s_k(n) \cdot s_k(n-1)}{\sum_{n=0}^{L-1} s_k(n)^2} \quad k=0,1,\ldots,3, \quad \text{(Equation 22)}$$

where L=80 is the window over which the reflection coefficient is calculated and $s_k(n)$ is the $k^{th}$ segment calculated by Equation 23.

$$s_k(n) = s(k \cdot 40 - 20 + n) \cdot w_h(n), \; n=0,1,\ldots 79 \quad \text{(Equation 23)}$$

In Equation 23, $w_h(n)$ is an 80 sample Hamming window and $s(0), s(1), \ldots, s(159)$ is the current frame of the pre-processed speech signal. The absolute maximum (tracking of absolute signal maximum 8 estimates per frame) can be calculated by Equation 24, $$\chi(k) = \max\{s(n)|, n = n_s(k), n_s(k)+1, \ldots, n_e(k)-1\}, \; k=0, 1, \ldots, 7 \quad \text{(Equation 24)}$$

where $n_s(k)$ and $n_e(k)$ is the starting point and end point, respectively, for the search of the $k^{th}$ maximum at time k·160/8 samples of the frame. Preferably, the segments overlap and the length of the segment is approximately one and one-half (1.5) times the pitch period. At this point, a smooth contour of the amplitude envelope is obtained. Thus, the spectral tilt, the absolute maximum, and the pitch correlation form the basis for the classification. However, significant processing and analysis of the spectral tilt, the absolute maximum, and the pitch correlation parameters are performed prior to the decision.

The parameter processing initially applies weighting to the three parameters. The weighting removes the background noise component in the parameters. This provides a parameter space that is "independent" from any background noise and thus more uniform which improves the robustness of the classification to background noise.

Running means of the pitch period energy of the noise, the spectral tilt of the noise, the absolute maximum of the noise, and the pitch correlation of the noise are updated 8 times per frame according to Equations 25 through 28. These updates are controlled by the VAD. The parameters defined by Equations 25 through 35 are estimated 8 times per frame and provides a finer time resolution of the parameter space. The running mean of the pitch period energy of the noise is calculated by Equation 25, $$<E_{N,p}(k)>=\alpha_1 \cdot <E_{N,p}(k-1)>+(1-\alpha_1) \cdot E_p(k)$$ (Equation 25)

where $E_{N,p}(k)$ is the normalized energy of the pitch period at time k·160/8 samples of the frame. It should be noted, that the segments over which the energy is calculated may overlap since the pitch period typically exceeds 20 samples (160 samples/8).

The running mean of the spectral tilt of the noise is calculated by Equation 26.

$$<\kappa_N(k)>=\alpha_1 \cdot <\kappa_N(k-1)>+(1-\alpha_1) \cdot \kappa(k \bmod 2)$$ (Equation 26)

The running mean of the absolute maximum of the noise is calculated by Equation 27.

$$<\chi_N(k)>=\alpha_1 \cdot <\chi_N(k-1)>+(1-\alpha_1) \cdot \chi(k)$$ (Equation 27)

The running mean of the pitch correlation of the noise is calculated by Equation 28, $$<R_{N,p}(k)>=\alpha_1 \cdot <R_{N,p}(k-1)>+(1-\alpha_1) \cdot R_p$$ (Equation 28)

where $R_p$ is the input pitch correlation for the second half of the frame. The adaptation constant $\alpha_1$ is adaptive, though the typical value is $\alpha_1=0.99$. The background noise to signal ratio is calculated by Equation 29.

$$\gamma(k) = \sqrt{\frac{<E_{N,p}(k)>}{E_p(k)}}$$ (Equation 29)

Preferably, the parametric noise attenuation is limited to 30 dB, i.e., $$\gamma(k)=\{\gamma(k)>0.968?0.968:\gamma(k)\}$$ (Equation 30)

The noise free set of parameters (weighted parameters) is obtained by removing the noise component according to Equations 31 through 33. Estimation of weighted spectral tilt is calculated by Equation 31.

$$\kappa_w(k)=\kappa(k \bmod 2)-\gamma(k) \cdot <\kappa_N(k)>$$ (Equation 31)

Estimation of weighted absolute maximum is calculated by Equation 32.

$$\chi_w(k)=\chi(k)-\gamma(k) \cdot <\chi_N(k)>$$ (Equation 32)

Estimation of weighted pitch correlation is calculated by Equation 33.

$$R_{w,p}(k)=R_p-\gamma(k) \cdot <R_{N,p}(k)>$$ (Equation 33)

The evolution or change of the weighted tilt and the weighted maximum is calculated according to Equations 34 and 35, respectively, as the slope of the first order approximation.

$$\partial \kappa_w(k) = \frac{\sum_{l=1}^{7} l \cdot (\kappa_w(k-7+l) - \kappa_w(k-7))}{\sum_{l=1}^{7} l^2}$$ (Equation 34)

$$\partial \chi_w(k) = \frac{\sum_{l=1}^{7} l \cdot (\chi_w(k-7+l) - \chi_w(k-7))}{\sum_{l=1}^{7} l^2}$$ (Equation 35)

Once the parameters of Equation 25 through 35 are updated for the 8 sample points of the frame, the following frame based parameters are calculated from the parameters defined by Equations 25 though 35. The maximum weighted pitch correlation is calculated by Equation 36.

$$R_{w,p}^{max}=\max \{R_{w,p}(k-7+l), l=0,1,\ldots,7\}$$ (Equation 36)

The average weighted pitch correlation is calculated by Equation 37.

$$R_{w,p}^{avg} = \frac{1}{8}\sum_{l=0}^{7} R_{w,p}(k-7+l)$$ (Equation 37)

The running mean of average weighted pitch correlation is calculated by Equation 38, $$<R_{w,p}^{avg}(m)>=\alpha_2 \cdot <R_{w,p}^{avg}(m-1)>+(1-a_2) \cdot R_{w,p}^{avg},$$ (Equation 38)

where m is the frame number and $a_2=0.75$ is the adaptation constant. Normalized standard deviation of pitch lag is calculated by Equation 39, $$\sigma_{L_p}(m) = \frac{1}{\mu_{L_p}(m)}\sqrt{\frac{\sum_{l=0}^{2}(L_p(m-2+l) - \mu_{L_p}(m))^2}{3}}$$ (Equation 39)

where $L_p(m)$ is the input pitch lag, and $\mu_{L_p}(m)$ is the mean of the pitch lag over the past three frames that can be expressed by Equation 40.

$$\mu_{L_p}(m) = \frac{1}{3}\sum_{l=0}^{2}(L_p(m-2+l)$$ (Equation 40)

The minimum weighted spectral tilt is calculated by Equation 41.

$$\kappa_m^{min} = \min\{\kappa_w(k-7+l), l=0,1,\ldots,7\} \quad \text{(Equation 41)}$$

The running mean of minimum weighted spectral tilt is calculated by Equation 42.

$$<\kappa_w^{min}(m)> = \alpha_2 \cdot <\kappa_w^{min}(m-1)> + (1-\alpha_2) \cdot \kappa_w^{min} \quad \text{(Equation 42)}$$

The average weighted spectral tilt is calculated by Equation 43.

$$\kappa_w^{avg} = \frac{1}{8}\sum_{l=0}^{7} \kappa_w(k-7+l) \quad \text{(Equation 43)}$$

The minimum slope of weighted tilt is calculated by Equation 44.

$$\partial\kappa_w^{min} = \min\{\partial\kappa_w(k-7+l), l=0,1,\ldots,7\} \quad \text{(Equation 44)}$$

The accumulated slope of weighted spectral tilt is calculated by Equation 45.

$$\partial\kappa_w^{acc} = \sum_{l=0}^{7} \partial\kappa_w(k-7+l) \quad \text{(Equation 45)}$$

The maximum slope of weighted maximum is calculated by Equation 46.

$$\partial\chi_w^{max} = \max\{\partial\chi_w(k-7+l), l=0,1\ldots,7\} \quad \text{(Equation 46)}$$

The accumulated slope of weighted maximum is calculated by Equation 47.

$$\partial\chi_w^{acc} = \sum_{l=0}^{7} \partial\chi_w(k-7+l) \quad \text{(Equation 47)}$$

The decision boundaries are complex, and the actual thresholds are operable to be programmed. Preferably, the parameters given by Equation 44, 46, and 47 are used to mark whether a frame is likely to contain an onset, and the parameters given by Equation 37, 38, 39, 41, 42 and 43 are used to mark whether a frame is likely to be dominated by voiced speech. Based on the initial marks, the past marks, and the VAD information, the frame is classified into one of four classes 0, 2, 3, or 5.

5. Classification to Control Pitch Pre-Processing.

The pitch pre-processing is controlled with a classifier that distinguishes between six categories. The categories are labeled numerically between −1 through 4. The module is based on the VAD information, the unvoiced noise-like detection, the signal characteristic classification, and the pitch correlation of the second half of the frame. The Class −1 is used to reset the pitch pre-processing to prevent an accumulated delay introduced during pitch pre-processing that exceeds the delay budget. In this embodiment, the remaining classes may indicate an increasing voicing strength and may be based on the pitch correlation information.

A. Waveform Interpolation and Pitch Pre-Processing.

The waveform interpolation and pitch pre-processing module has four functions. First, the signal is modified to better match the estimated pitch track and more accurately fit the coding model while being perceptually indistinguishable from the unmodified signal. Second, certain irregular transition segments are modified to better fit the coding model. The modification enhances the regularity and suppresses the irregularity using forward-backward waveform interpolation. Again, the modification occurs without a loss of perceptual quality. Third, the pitch gain and pitch correlation for the modified signal are estimated. Finally, the signal characteristic classification is refined based on the additional signal information that is obtained during the analysis for the waveform interpolation and pitch-preprocessing.

6. Pitch Pre-Processing.

The pitch pre-processing occurs on a frame-by-frame basis. The analysis and signal modification are based on the perceptually weighted speech rather than the LPC residual signal. Preferably, the system performs continuous time warping as opposed to simple integer sample shifting of the signal. The warping introduces a variable delay of a maximum of approximately 20 samples (or about 2.5 ms) at the encoder. The delay is limited to a maximum of approximately 20 samples so that the system does not exceed the overall maximum delay according to the ITU-T terms of reference. The time-warped signal is estimated using Hamming weighted Sinc interpolation filters. The signal is preferably modified on a pitch cycle by pitch cycle basis. During the analysis certain overlap between adjacent pitch cycles is incorporated to avoid discontinuities between the reconstructed/modified segments. The signal is modified according to the input pitch track, which is derived from the lags of the past and current frames.

The classification controls the pitch pre-processing in the following way. If the frame is predominantly background noise or unvoiced speech with a low pitch correlation (pitch pre-processing Class −1) the frame remains unchanged and the accumulated delay of the pitch pre-processing is reset to zero. If the signal is pre-dominantly pulse-like unvoiced speech (pitch pre-processing Class 0), the accumulated delay is maintained without any warping of the signal, and the output signal is a simple time shift (according to the accumulated delay) of the input signal. For the remaining pitch pre-processing classes the core of the pitch pre-processing method is executed to optimally warp the signal.

A. Estimate Segment Size.

The segment size is preferably equal to the pitch period, though some adjustments may be necessary. In general, the pitch complex (the main pulses) of the pitch cycle is located towards the end of the segment to allow for maximum accuracy of the warping on the perceptual most important part, the pitch complex. For a given segment the starting point is fixed by the past and the end point is moved for a best fit, which stretches or compresses the time scale. Consequently, the samples at the beginning of the segment are shifted only slightly, while the end of the segment has the greatest shift.

B. Estimate Target Signal for Warping.

The target signal for the time-warping is a synthesis of the current segment derived from the previous modified weighted speech $s'_w(n)$ and the input pitch track $L_p(n)$. According to the pitch track $L_p(n)$, each sample value of the target signal $s_w'(n), n=0,\ldots,N_s-1$ is obtained by interpolation of the previously modified weighted speech using a 21$^{st}$ order Hamming weighted Sinc window as expressed by Equation 48.

$$s'_w(n) = \sum_{i=-10}^{10} w_s(f(L_p(n)), i) \cdot s'_w(n - i(L_p(n))) \text{ for } n = 0, \ldots, N_s - 1 \quad \text{(Equation 48)}$$

In Equation 48, $i(L_p(n))$ and $f(L_p(n))$ are the integer and fractional parts of the pitch lag, respectively, $w_s(f,i)$ is the Hamming weighted Sinc window, and $N_s$ is the length of the segment.

C. Estimate Warping Function.

The warping function is estimated to maximize the normalized correlation between the weighted target signal and the warped weighted speech, i.e., by maximizing Equation 49, $$R_{warp} = \frac{\sum_{n=0}^{N_s-1} s_w^{wt}(n) \cdot f_{warp}(s_w(n + \tau_{acc}))}{\sqrt{\left(\sum_{n=0}^{N_s-1} s_w^{wt}(n)^2\right) \cdot \left(\sum_{n=0}^{N_s-1} f_{warp}(s_w(n + \tau_{acc}))^2\right)}} \quad \text{(Equation 49)}$$

where $s_w(n+\tau_{acc})$ is the weighted speech shifted according to the accumulated delay $\tau_{acc}$ of the past pitch pre-processing, $f_{warp}(s(n))$ is the warping function, and $s_w^{wt}(n)$ is the weighted target that can be expressed as Equation 50.

$$s_w^{wt}(n) = w_e(n) \cdot s_w^t(n) \quad \text{(Equation 50)}$$

The weighting function $w_e(n)$ is a two-piece linear function emphasizing the pitch complex and de-emphasizing the "noise" that occurs between pitch complexes. The weighting is adapted according to the pitch pre-processing classification increasing the emphasis for segments of higher periodicity.

The warping function is estimated by initially estimating the integer shift that maximizes the normalized cross correlation between the weighted target $s_w^{wt}(n)$ and the input weighted speech $s_w(n+\tau_{acc})$ according to Equation 51, $$\tau_{shift} = \arg\max \{R_n(\tau_{shift}), \tau_{shift} = \tau_0, \ldots, \tau_1\} \quad \text{(Equation 51)}$$

where $$R_n(\tau_{shift}) = \frac{\sum_{n=0}^{N_s-1} s_w^{wt}(n) \cdot s_w(n + \tau_{acc} + \tau_{shift})}{\sqrt{\left(\sum_{n=0}^{N_s-1} s_w^{wt}(n)^2\right) \cdot \left(\sum_{n=0}^{N_s-1} s_w(n + \tau_{acc} + \tau_{shift})^2\right)}}, \quad \text{(Equation 52)}$$

and $\tau_0$ and $\tau_1$ specify the search range. The refined shift (including fractional shift) is determined by searching an upsampled version of $R_n(\tau_{shift})$ in the vicinity of $\tau_{shift}$. This search results in the calculation of the final optimal shift $\tau_{opt}$, and the corresponding normalized cross correlation $R_n(\tau_{opt})$.

D. Estimate Warped Signal.

The modified weighted speech for the segment is reconstructed according to the mapping can be expresses as:

$$[s_w(n+\tau_{acc}), s_w(n+\tau_{acc}+\tau_c+\tau_{opt})] \rightarrow [s'_w(n), s'_w(n+\tau_c-1)], \quad \text{(Equation 53)}$$

and $$[s_w(n+\tau_{acc}+\tau_c+\tau_{opt}), s_w(n+\tau_{acc}+\tau_{opt}+N_s-1)] \rightarrow [s'_w(n+\tau_c), s'_w(n+N_s-1)], \quad \text{(Equation 54)}$$

where $\tau_c$ is a parameter defining the warping function. The mappings specify the beginning of the pitch complex. The mapping given by Equation 53 specifies a time warping, and the mapping given by Equation 54 specifies a time shift (no warping). Both are calculated by using a Hamming weighted Sinc window function.

7. Waveform Interpolation.

The waveform interpolation is integrated with the pitch pre-processing. It is performed on a pitch cycle by pitch cycle basis equivalently to the pitch pre-processing. The waveform interpolation is performed following the estimation of the warped signal at the pitch cycle level, i.e., reconstruction of the modified weighted speech. The main objective of the waveform interpolation is to improve the onsets. Suppose that the current segment contains the first main pitch complex (pulse) of the voiced segment. This means that the correlation with the past will be low and pitch pre-processing will have little benefit. In order to facilitate a rapid build-up of the onset in the following segments, the current segment (pitch cycle) is modified as the weighted sum of the past pitch cycle and the following pitch cycle if the benefit is significant. This will artificially increase the pitch correlation for the next segment, and enhance the contribution from the pitch pre-processing in the future. Consequently, this will increase the contribution from the adaptive codebook during onsets resulting in a faster build-up.

A candidate segment (to replace the current segment) is estimated by predicting the current pitch cycle from the past (forward prediction) and the future (backward prediction). The forward prediction is already available as the target for the pitch pre-processing, Equation 48, or i.e., $$v_{fw}(n) = s'_w(n). \quad \text{(Equation 55)}$$

The backward prediction $v_{bw}(n)$ is derived as the shift of the next pitch cycle of the original weighted speech that results in the best match to the modified weighted speech of the pitch processing, i.e., $$\tau_{shif}^{bw} = \arg\max \{R_n^{bw}(\tau_{shif}^{bw}), \tau_{shif}^{bw} = \tau_0, \ldots, \tau_1\}, \quad \text{(Equation 56)}$$

where $$R_n^{bw}(\tau_{shif}^{bw}) = \frac{\left(\sum_{n=0}^{N_s-1} w_e(n) \cdot s'_w(n) \cdot s_w(n + L_p + \tau_{acc} + \tau_{opt} + \tau_{sgif}^{bw})\right)}{\sqrt{\left(\sum_{n=0}^{N_s-1} (w_e(n) \cdot s'_w(n))^2\right) \cdot \left(\sum_{n=0}^{N_s-1} s_w(n + L_p + \tau_{acc} + \tau_{opt} + \tau_{shif}^{bw})^2\right)}}, \quad \text{Equation 57}$$

and $\tau_0$ and $\tau_1$ specify the search range. The weighting function $w_e(n)$ is similar to the weighting during the pitch pre-processing. The refined shift (including fractional shift) is determined by searching an upsampled version of $R_n^{bw}(\tau_{shif}^{bw})$ in the vicinity of $\tau_{shif}^{bw}$. This results in the final optimal shift $\tau_{opt}^{bw}$ and the corresponding normalized cross correlation $R_n^{bw}(\tau_{opt}^{bw})$. Based on the final optimal shift the backward prediction is derived by Equation 58, $$v_{bw}(n) = \sum_{i=-10}^{10} w_s(f(L_p + \tau_{acc} + \tau_{opt} + \tau_{opt}^{bw}), i) \cdot s_w(n + i(L_p + \tau_{acc} + \tau_{opt} + \tau_{opt}^{bw})) \text{ for } n = 0, \ldots, N_s - 1$$

(Equation 58)

where $i(\tau)$ and $f(\tau)$ are the integer and farctional parts of the argument $\tau$, respectively, $w_s(f,i)$ is the Hamming weighted Sinc window, and $N_s$ is the length of the segment.

The forward and backward predictions are combined to form the predicted segment according to Equation 59, $$v_p(n) = g_n \cdot (v_{fw}(n) + \beta \cdot v_{bw}(n)),$$ (Equation 59)

where $\beta$ is 1 if the backward prediction is successful ($R_n^{bw}(\tau_{opt}^{bw})$ above certain threshold) and 0 if the backward prediction is unsuccessful. The gain factor $g_n$ normalizes the energy of the predicted segment to the energy of the modified weighted speech from the pitch pre-processing, i.e., $$g_n = \sqrt{\frac{\sum_{n=0}^{N_s-1} s'_w(n)^2}{\sum_{n=0}^{N_s-1} (v_{fw}(n) + \beta \cdot v_{bw}(n))^2}}.$$ (Equation 60)

The final candidate for the segment $v_c(n)$ is calculated as a weighted sum of the predicted segment $v_p(n)$ and the output segment from the pitch pre-processing $s'_w(n)$ according to Equation 61, $$v_c(n) = \alpha(n) \cdot s'_w(n) + (1 - \alpha(n)) \cdot v_p(n)$$ (Equation 61)

where the weighting provides a smooth transition from $v_c(n)$ to $s'_w(n)$ at the beginning of the segment and at the end of the pitch cycle.

The candidate segment $v_c(n)$ only replaces the output segment from the pitch pre-processing if it provides a better match to the weighted target signal given by Equation 50, or i.e., $$s'_w(n) = \begin{cases} v_c(n) & \text{if } \left\{ \frac{\sum_{n=0}^{N_s-1} v_c(n) \cdot s_w^{wt}(n)}{\sqrt{\left(\sum_{n=0}^{N_s-1} v_c(n)^2\right)\left(\sum_{n=0}^{N_s-1} s_w^{wt}(n)^2\right)}} > 1.1 \cdot R_n(\tau_{opt}) \right\} \\ s'_w(n) & \text{otherwise.} \end{cases}$$ (Equation 62)

In addition, the replacement is also contingent upon the absolute match $R_n(\tau_{opt})$ of the pitch pre-processing. Preferably, the candidate from the waveform interpolation is accepted if the pitch pre-processing fails and the candidate provides a good match to the target signal.

8. Pitch Gain and Pitch Correlation Estimation.

The pitch gain and pitch correlation is available on a pitch cycle basis. The pitch gain is estimated in order to minimize the mean squared error between the target $s'_w(n)$, Equation 48 and the final modified signal $s'_w(n)$, Equation 62, and is given by Equation 63.

$$g_a = \frac{\sum_{n=0}^{N_s-1} s'_w(n) \cdot s'_w(n)}{\sum_{n=0}^{N_s-1} s'_w(n)^2}$$ (Equation 63)

The pitch correlation is given by Equation 64.

$$R_a = \frac{\sum_{n=0}^{N_s-1} s'_w(n) \cdot s'_w(n)}{\sqrt{\left(\sum_{n=0}^{N_s-1} s'_w(n)^2\right) \cdot \left(\sum_{n=0}^{N_s-1} s'_w(n)^2\right)}}$$ (Equation 64)

Both parameters are available on a pitch cycle basis and are linearly interpolated in order to estimate the parameters at the regular three subframes per frame.

9. Refine Signal Characteristic Classification.

Based on the average pitch correlation and pitch gains estimated during pitch pre-processing the Class 6, "Stationary Voiced," is introduced. Furthermore, based on a refined noise-like unvoiced detection the Class 1, "Noise-Like Unvoiced Speech," is distinguished. This completes the signal characteristic classification.

A. Mode Selection.

The mode selection is controlled by the signal characteristic classification. If the frame is classified as "Stationary Voiced," Class 6, the frame is encoded using Mode 1. For Class 0 through 5, the frame is encoded using Mode 0. The mode information is added to the bit-stream and transmitted to the decoder.

The two modes are referred as suitable for "non-periodic"-like and "periodic"-like frames. However, this labeling should be interpreted with some care. The frames encoded using Mode 1 are those maintaining a high pitch correlation and high pitch gain throughout the frame based on the pitch track derived from only 7 bits per frame. Consequently, the selection of Mode 0 rather than Mode 1 can be due to an inaccurate representation of the pitch track with only 7 bits, and not necessarily due to the absence of periodicity. Hence, signals encoded with Mode 0 may contain periodicity, though not well represented by only 7 bits per frame for the pitch track. Therefore, Mode 0 encodes the pitch track with 7 bits twice per frame (14 bits total per frame) in order to represent the pitch track properly.

10. Mode 0 Processing.

If the mode selection in the FIG. 3 dictates Mode 0, the encoding proceeds according to the mode optimized for "non-periodic"-like signals. A block diagram of the Mode 0 processing (subsequent to the processing of FIG. 3) is presented in FIG. 4. This mode is similar to the traditional CELP encoding of G.729. In Mode 0, the frame is divided into two subframes. All functions in the block diagram are executed on a subframe basis.

Figure 4:
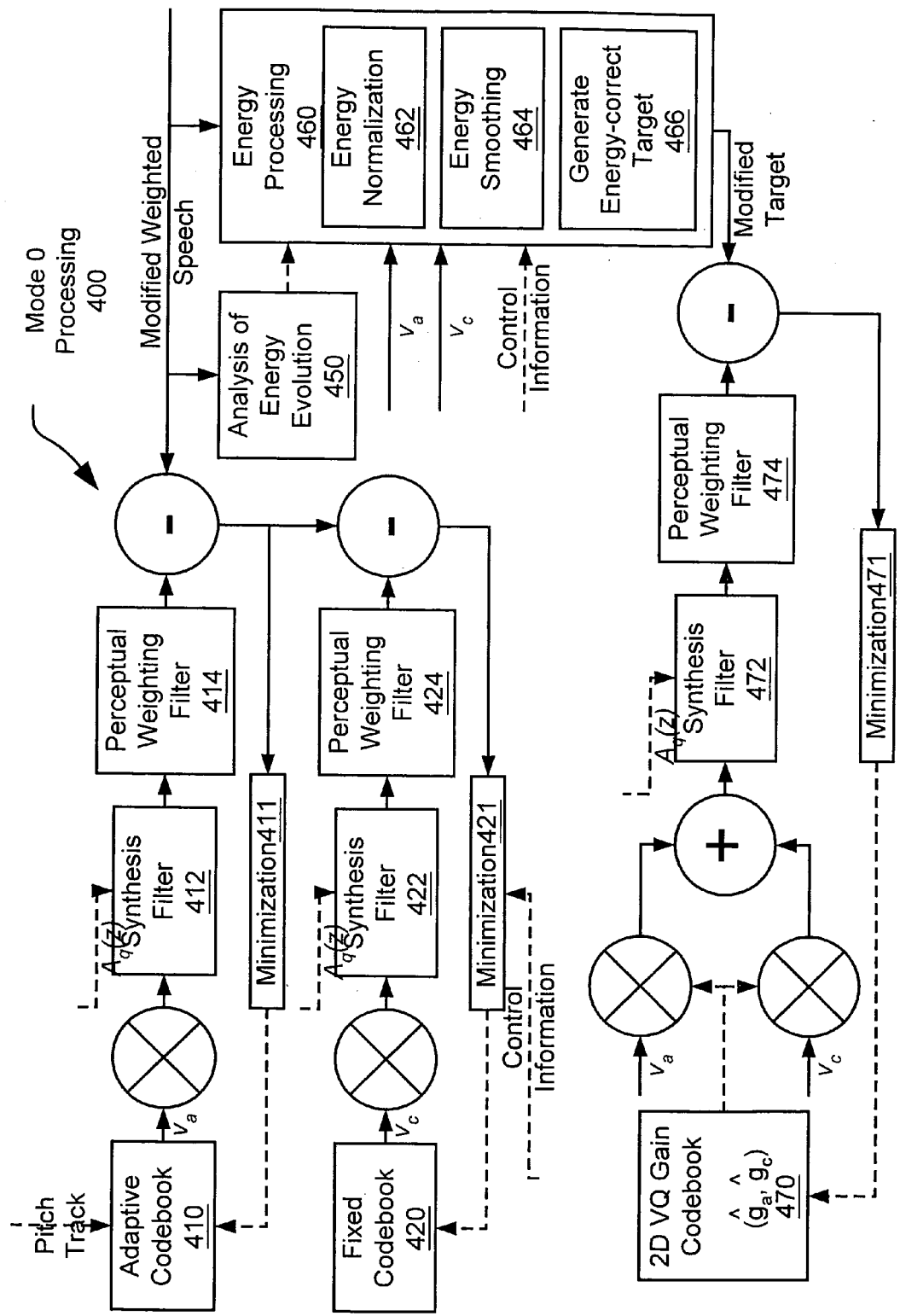
FIG. 4 is a block diagram of a Mode zero speech coding system.

A pitch track is provided to an adaptive codebook 410 as shown in FIG. 4. A code-vector, shown as $v_a$, is provided from the adaptive codebook 410. After passing through a gain stage, it is fed into a synthesis filter 412. The output of the synthesis filter 412 is passed through a perceptual weighting filter 414 that generates an output that is received by a first summing junction. The first summing junction also receives an input from a modified weighted speech. The modified weighted speech is also received by an analysis of energy evolution block 450 and an energy processing block 460. The energy processing block 460 comprises an energy normalization block 462, an energy smoothing block 464, and a generate energy-correct target block 466. The output of the first summing junction is fed to a minimization block 411 that generates an output used to modify selection within the adaptive codebook 410. That output is also fed to a second summing junction.

A fixed codebook 420 provides a code-vector, shown as $v_c$, to a gain stage that generates an output received by a synthesis filter 422. The output of the synthesis filter 422 is passed through a perceptual weighting filter 424 before being received by a second summing junction. The output of the second summing junction is fed to a minimization block 421 that generates an output used to modify selection within the fixed codebook 420. Control information is also provided to the minimization block 421.

In addition, a two dimensional vector quantization (2D VQ) gain codebook 470 provides input to two gain stages, and the outputs from those gain stages are passed to a synthesis filter 472 after being combined at a third summing junction. The output of the synthesis filter 472 is passed through a perceptual weighting filter 474 before being received by a fourth summing junction that receives input from the energy processing block 460 via a modified target signal. Control information and the code-vectors $v_a$ and $v_c$ are used to generate the modified target signal. The output from the fourth summing junction is received by a minimization block 471 that generates an output received by the 2D VQ gain codebook 470.

A. Adaptive Codebook Search.

The contribution from the adaptive codebook (the past excitation) is specified with 7 bits. The 7 bits represent a delay from 17 to 127 samples. The delay (pitch period) is non-uniformly distributed and includes fractional delays between about 17 and 40 samples, and only integer delays above about 40 samples.

Initially, the integer lag from the open loop pitch estimation is refined. The search minimizes the weighted mean-squared error (WMSE) between the original and reconstructed speech. The cross-correlation function is searched within a range of three samples of the open loop pitch estimate according to Equation 65, $$L_p^1 = \arg\max \{R_n(L_p^1), L_p^1 = L_p - 3 \ldots, L_p - 3\} \quad \text{(Equation 65)}$$

where $L_p$ is the open loop pitch estimate, and $L_p^1$ is the refined integer pitch lag estimate. The cross-correlation function R(l) is expressed by Equation 66, $$R(l) = \frac{\sum_{n=0}^{79} t(n) \cdot (e(n-l) * h(n))}{\sqrt{\sum_{n=0}^{79} (e(n-l) * h(n))^2}}, \quad \text{(Equation 66)}$$

where t(n) is the target signal, e(n) is the excitation (the adaptive codebook), and h(n) is the perceptually weighted impulse response of the LPC synthesis filter. The relationship between the excitation e(n) and the vector from the adaptive codebook $\vec{v}_a^j$ can be expressed as:

$$e(n-l) = v_a^{idx(l)}(n), \quad \text{(Equation 67)}$$

where the function idx(l) maps the delay/lag l to the proper index.

The final pitch lag (adaptive codebook contribution) is determined by searching the entries in the adaptive codebook that correspond to lags that are within one sample of the refined integer lag. This may or may not include fractional lags depending on the value of the refined integer lag. The cross-correlation function given by Equation 66 is interpolated and low-pass filtered using a $13^{th}$ order Hamming weighted Sinc window to provide the cross-correlation at the relevant lags.

The optimal WMSE pitch gain is estimated according to Equation 68, $$g = \frac{\sum_{n=0}^{79} t(n) \cdot (e(n - L_p^{opt}) * h(n))}{\sum_{n=0}^{79} (e(n - L_p^{opt}) * h(n))^2} \text{ bounded by } 0.0 \le g \le 1.2 \quad \text{(Equation 68)}$$

where $L_p^{opt}$ is the final pitch lag calculated to minimize the WMSE between the original speech signal and the reconstructed speech signal. The unquantized pitch gain is calculated according to the following weighting of the optimal pitch gain expressed in Equation 69, $$g_a = \left(\frac{1}{2} R_n(L_p^{opt}) + \frac{1}{2}\right) \cdot g \quad \text{(Equation 69)}$$

where the normalized cross-correlation is given by Equation 70.

$$R_n(L_p^{opt}) = \frac{\sum_{n=0}^{79} t(n) \cdot (e(n - L_p^{opt}) * h(n))}{\sqrt{\left(\sum_{n=0}^{79} t(n)^2\right) \cdot \left(\sum_{n=0}^{79} (e(n - L_p^{opt}) * h(n))^2\right)}} \quad \text{(Equation 70)}$$

This weighting de-emphasizes the pitch contribution from the adaptive codebook prior to the fixed codebook search, leaving more of the pitch information in the target signal for the fixed codebook search.

B. Fixed Codebook Search.

The fixed codebook excitation is represented by 15 bits in Mode 0. The codebook has three sub codebooks, where two are pulse codebooks and the third is a Gaussian codebook. The 2-pulse codebook has 16384 entries, the 3-pulse codebook has 8192 entries, and the Gaussian codebook has 8192 entries. This adds up to a total of 32768 entries equivalent to 15 bits. Weighting of the WMSE from the different sub codebooks is applied in order to favor the excitation most suitable from a perceptual point of view.

The initial target for the fixed codebook is calculated from the weighted pre-processed speech with the zero-response removed, i.e., the target for the adaptive codebook and the optimal adaptive codebook excitation and gain is calculated according to Equation 71.

$$t'(n)=t(n)-g_a\cdot(e(n-L_p^{opt})*h(n)) \quad \text{(Equation 71)}$$

The perceptual weighting for the search of the fixed codebook is adapted according to the instantaneous Noise to Signal Ratio (NSR) by an adaptive $1^{st}$ order filter. When the NSR is above −2.5 dB (the signal is less than 2.5 dB above the noise floor) a $1^{st}$ order filter is added to the regular perceptual weighting filter. This additional weighting filter is introduced by filtering both the target t'(n) and the LPC synthesis filter response h(n) prior to the codebook search. The $1^{st}$ order filter is preferably defined by Equation 72, $$H'_w(z) = \frac{1}{1-\eta z^{-1}} \quad \text{(Equation 72)}$$

where the filter coefficient η is calculated as follows:

$$\eta = -0.25 \cdot \frac{\sum_{n=1}^{n=30} h(n) \cdot h(n-1)}{\sum_{n=0}^{n=30} h(n)^2}. \quad \text{(Equation 73)}$$

Preferably, an objective of the filter of Equation 72 is to provide slightly better matching of the high frequency energy in high-level background noise segments. The resulting target and synthesis filter response are denoted t"(n) and h"(n), respectively. When the signal is more than 2.5 dB above the noise floor no additional weighting is applied, i.e., t"(n)=t'(n) and h"(n)=h(n).

Prior to the search of the three sub codebooks, some characteristics are built into the excitation of the two pulse sub-codebooks to enhance the perceptual quality. This may be achieved by modifying the filter response of the synthesis filter for the codebook search. The first characteristic is introduced with a phase dispersion filter that spreads the pulses of the two pulse codebooks. The filter is preferably fixed and modifies only the high-frequency phase. The filter is designed in the frequency domain with zero-phase and unity magnitude at frequencies below 2 kHz, and with an appropriate pseudo random phase and unity magnitude at frequencies above 2 kHz. The filter may be transformed into the time domain resulting in the impulse response $h_n(n)$. The phase dispersion is preferably incorporated into the synthesis filter response for the codebook search according to Equation 74.

$$h_1(n)=h_n(n)*h''(n) \quad \text{(Equation 74)}$$

Second, for pitch lags greater than a subframe size (80 samples) the traditional pitch enhancement does not contribute to the fixed codebook excitation. To compensate the resulting sparseness for high pitch lags, 2 correlation factors of delays less than the subframe size are adaptively inserted by modifying the response of the synthesis filter for the codebook search. The inserted enhancement, increases the density of the fixed codebook excitation. The strength and relative delay of the 2 correlation factors are estimated based on a WMSE between the quantized weighted speech of a past subframe and a segment delayed further between about 3 to 79 samples. The current subframe incorporates the two most significant correlation factors of the most recent past. Since the estimation is based on the past, the decoder is able to perform the identical operation. The two delays are calculated by Equation 75, $$L_c=\max\{R(l),l=3,4,\ldots,79\} \quad \text{(Equation 75)}$$

where the correlation function is given as follows:

$$R(l) = \frac{\left(\sum_{j=0}^{79} \hat{s}_w(n-80+j)\cdot \hat{s}_w(n-80-l+j)\right)^2}{\sum_{j=0}^{79} \hat{s}_w(n-80-l+j)^2}, \quad \text{(Equation 76)}$$

where $\hat{s}_w(n)$ is the weighted past quantized speech and $\hat{S}_w(z)$ is expressed by Equation 77, $$\hat{S}_w(z) = \frac{1}{A_q\left(\frac{z}{0.75}\right)} \cdot \hat{E}(z) \quad \text{(Equation 77)}$$

where $\hat{E}(z)$ is the past quantized excitation. This results in the two optimal delays $L_{c1}$ and $L_{c2}$. The gain for each of the two delays is estimated as a weighting of the normalized cross-correlation, and the filter is given by Equation 78, $$h_c(n) = \begin{cases} \beta \cdot \dfrac{\sum_{j=0}^{79} \hat{s}_w(n-80+j)\hat{s}_w(n-80-L_c+j)}{\sqrt{\left(\sum_{j=0}^{79} \hat{s}_w(n-80-L_c+j)^2\right)\cdot\left(\sum_{j=0}^{79} \hat{s}_w(n-80+j)^2\right)}} & n = L_c \\ 0 & n \neq L_c \end{cases} \quad \text{(Equation 78)}$$

where the weighting factor β is 0.25 when the delay is in the vicinity of the pitch lag and 0.5 otherwise. The final response of the synthesis filter for the search of the two pulse codebooks can be expressed by Equation 79.

$$h_2(n) = h_{c2} * (h_{c1} * h_1(n)) \qquad \text{(Equation 79)}$$

The modifications of the excitation described by Equations 74 and 79 are only done for the two pulse sub codebooks, and not for the Gaussian sub codebook. Therefore, for the search of the Gaussian sub codebook the unmodified response of the synthesis filter h"(n) is used.

C. 2-Pulse Codebook.

The 2-pulse codebook is searched in a closed-loop to minimize the perceptually weighted mean-squared error between the original and the reconstructed speech. The MSE between the candidate excitation convoluted with the weighted response of the synthesis filter given by Equation 79 and the target t"(n) that is minimized according to Equation 80, $$c_{2P}(n) = \arg\max\left\{\frac{\left(\sum_{n=0}^{79} t''(n) \cdot (c_{2P}(n) * h_2(n))\right)^2}{\sum_{n=0}^{79} (c_{2P}(n) * h_2(n))^2},\right.$$
$$\left. c_{2P}(n) \in \{c_{2P}^l(n), l = 0, \ldots, 16383\}\right\} \qquad \text{(Equation 80)}$$

where $c_{2P}^l(n), l=0, \ldots, 16383$ are the candidate excitation vectors from the 2-pulse codebook, and $c_{2P}(n)$ is the best candidate. Each pulse is restricted to a track where 6 bits specify the position in the track, and 1 bit specifies the sign of the pulse. This is equivalent to a total of 14 bits (16384 entries). The two tracks may be constructed from the following 5 sub tracks:

$T_0$: {0,5,10,15,20,25,30,35,40,45,50,55,60,65,70,75}

$T_1$: {1,6,11,16,21,26,31,36,41,46,51,56,61,66,71,76}

$T_2$: {2,7,12,17,22,27,32,37,42,47,52,57,62,67,72,77}

$T_3$: {3,8,13,18,23,28,33,38,43,48,53,58,63,68,73,78}

$T_4$: {4,9,14,19,24,29,34,39,44,49,54,59,64,69,74,79}

The tracks for the 2 pulses may be given by:

$T_{p1}$: $T_0 \cup T_1 \cup T_2 \cup T_3$ $T_{p2}$: $T_1 \cup T_2 \cup T_3 \cup T_4$ where each track has 64 pulse positions (6 bits).

Pitch enhancement is applied to the 2-pulse codebook in both forward and backward direction. This concept is illustrated in the FIG. 5. The forward-backward pitch enhancement is specified with the lag $l_{pe}$ and gain $g_{pe}$ where $$l_{pe} = \begin{cases} L_p & L_p < 80 \\ \frac{1}{2}L_p & L_p \geq 80 \end{cases}, \qquad \text{(Equation 81)}$$

and $$g_{pe} = \begin{cases} 0.75 & L_p < 80 \\ 0.25 & L_p \geq 80 \end{cases}, \qquad \text{(Equation 82)}$$

where $L_p$ is the integer part of the pitch lag. It is incorporated into the pulses $c_{2P}^l(n), l=0, \ldots, 16383$ when searching the codebook according to Equation 80. Preferably, a reduced complexity search is applied to maintain low complexity.

D. 3-Pulse Codebook.

The 3-pulse codebook is searched in a closed-loop to minimize the perceptually weighted mean-squared error between the original and the reconstructed speech. The MSE between the candidate excitation convoluted with the weighted response of the synthesis filter is given by Equation 79 and the target t"(n) is minimized according to Equation 83, $$c_{3P}(n) = \arg\max\left\{\frac{\left(\sum_{n=0}^{79} t''(n) \cdot (c_{3P}(n) * h_2(n))\right)^2}{\sum_{n=0}^{79} (c_{3P}(n) * h_2(n))^2},\right.$$
$$\left. c_{3P}(n) \in \{c_{3P}^l(n), l = 0, \ldots, 8191\}\right\} \qquad \text{(Equation 83)}$$

where $c_{3P}^l(n), l=0, \ldots, 8191$ are the candidate excitation vectors from the 3-pulse codebook, and $c_{3P}(n)$ is the best candidate. The 3-pulse codebook is constructed by a specification of an absolute point by 4 bits (from a track of 16 positions) and the position of each of the 3 pulses relative to the absolute point with 2 bits and 1 bit for the sign. This results in 4+3·(2+1)=13 bits or 8192 entries. The track for the absolute point is expressed below:

$T_{abs}$: {0,4,8,12,16,20,24,28,33,38,43,48,53,58,63,68}, and the relative tracks for the 3 pulse are:

$\Delta T_{p1}$: {0,3,6,9}

$\Delta T_{p2}$: {1,4,7,10}

$\Delta T_{p3}$: {2,5,8,11}

Figure 5:
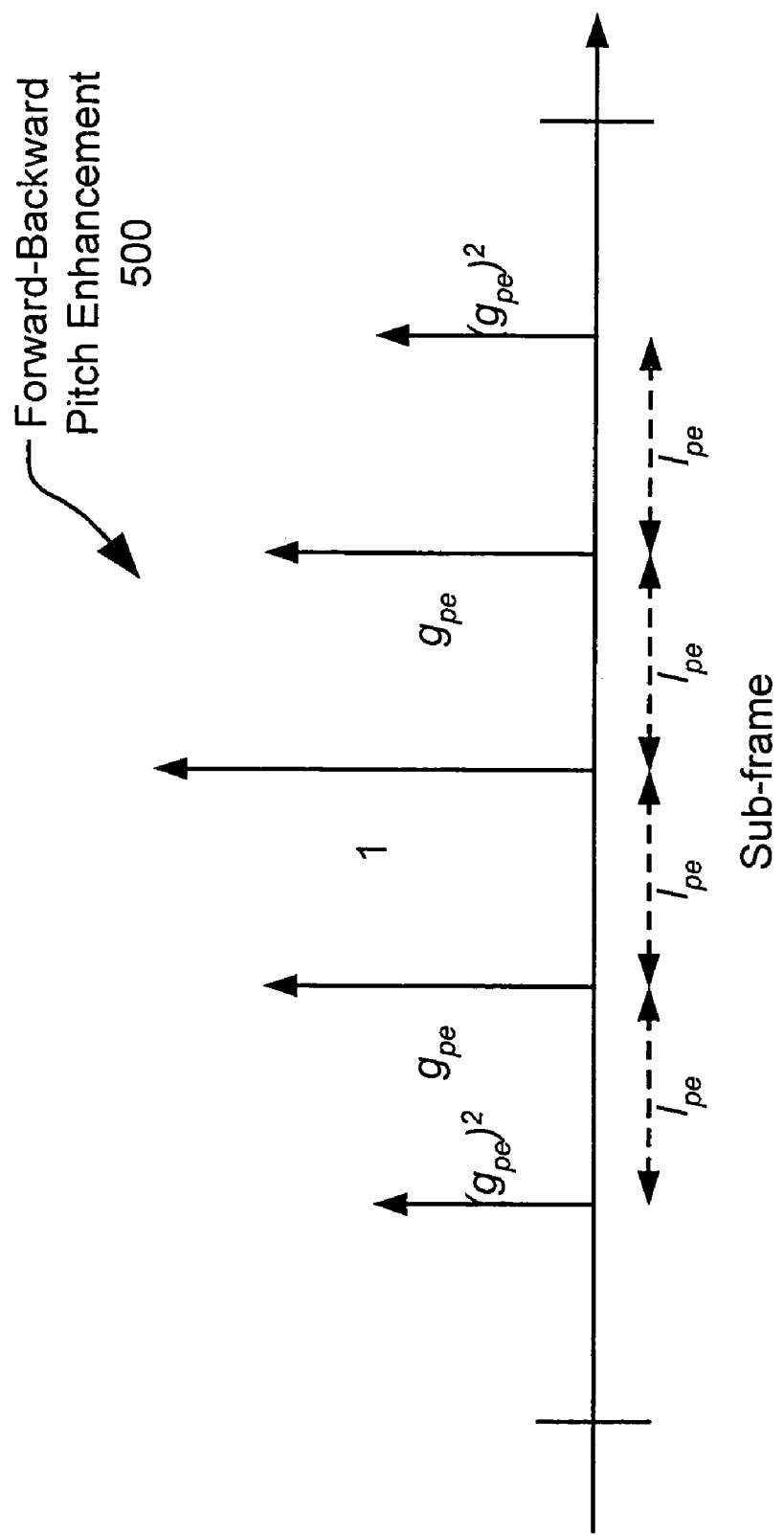
FIG. 5 is a graph of a forward-backward pitch enhancement.

Pitch enhancement is applied to the 3-pulse codebook using forward-backward pitch enhancement as illustrated in FIG. 5. The parameters are expressed in Equations 84 and 85, $$l_{pe} = \begin{cases} L_p & L_p < 80 \\ \frac{1}{2}L_p & L_p \geq 80 \end{cases}, \qquad \text{(Equation 84)}$$

and $$g_{pe} = \begin{cases} 0.250 & L_p < 80 \\ 0.125 & L_p \geq 80 \end{cases}, \quad \text{(Equation 85)}$$

where $L_p$ is the integer part of the pitch lag. The pitch enhancement is incorporated into the pulses $c_{3P}{}^l(n), l=0, \ldots, 8192$ when searching the codebook according to Equation 83. Preferably, a reduced complexity search is applied to maintain low complexity.

E. Gaussian Codebook.

The Gaussian codebook is searched in a closed-loop to minimize the perceptually weighted mean-squared error between the original and the reconstructed speech. The Gaussian excitation vector is constructed from two orthogonal basis vectors, where the first basis vector contains all the even sample points in the subframe, and the second basis vector contains all the odd sample points. Each basis vector has a dimension of 40, and the same pseudo Gaussian codebook is used for the two basis vectors. For each basis vector, 45 candidates are considered and 1 bit is used to specify the sign. This results in $(45 \cdot 2) \cdot (45 \cdot 2) = 8100$ entries which is specified by 13 bits. The remaining 192 entries are not used.

In order to reduce the complexity, two candidates are pre-selected in open-loop for each basis vector by maximizing the cross correlation functions $|R_1(l)|$ and $|R_2(l)|$ respectively, as seen in Equations 86 and 87, $$R_1(l) = \sum_{n=0}^{39} e_2(2 \cdot n) \cdot c_{Ga}^l(n), \quad l = 0, \ldots, 44, \quad \text{(Equation 86)}$$

$$R_2(l) = \sum_{n=0}^{39} e_2(2 \cdot n + 1) \cdot c_{Ga}^l(n), \quad l = 0, \ldots, 44, \quad \text{(Equation 87)}$$

where $e_2(n)$ is the residual after removal of the contribution from the adaptive codebook, and $c_{Ga}{}^l(n), l=0, \ldots, 44$ is the candidate excitation vectors from the Gaussian codebook (the same for both basis vectors). The signs of the candidate vectors $sgn(R_1(l))$ and $sgn(R_2(l))$ are determined as the sign of the correlation functions $R_1(l)$ and $R_2(l)$ for the respective candidate vectors. The final candidate is determined among the four possible combinations of the pre-selected candidates for the two basis vectors by maximizing Equation 88, $$R(l_1, l_2) = \frac{\left(\sum_{j=0}^{79} t''(n) \cdot c_{Ga}^{l_1,l_2}(n) * h''(n)\right)^2}{\sum_{j=0}^{79} \left(c_{Ga}^{l_1,l_2}(n) * h''(n)\right)^2}, \quad \text{(Equation 88)}$$

$$l_1 = L_1(0), L_1(1), l_2 = L_2(0), L_2(1)$$

where $L_1(0), L_1(1)$ and $L_2(0), L_2(1)$ specifies the candidate vectors for the two basis vectors. The Gaussian code vector is reconstructed according to Equation 89.

$$c_{Ga}^{l_1,l_2}(n) = \begin{cases} sgn(R_1(l_1)) \cdot c_{Ga}^{l_1}\left(\frac{n}{2}\right) & n \text{ even} \\ sgn(R_2(l_2)) \cdot c_{Ga}^{l_2}\left(\frac{n-1}{2}\right) & n \text{ odd} \end{cases}, \quad n = 0, \ldots, 79 \quad \text{(Equation 89)}$$

No pitch enhancement or enrichment of the excitation as specified by Equation 74 and 79, respectively, is performed for the Gaussian sub codebook.

F. Final Selection.

The selection of the final fixed codebook excitation involves comparing the WMSE of the best candidate from each of the three sub codebooks after applying appropriate weighting according to the classification information. The modifications of the excitation described by Equations 74 and 79 and the forward-backward pitch enhancement are incorporated into the excitation when appropriate, i.e., if the final fixed codebook excitation is selected from the either of the two pulse codebooks. The final fixed codebook excitation is denoted $\vec{v}_c$ or $v_c(n)$.

G. Analysis of Energy Evolution.

The "Analysis of Energy Evolution" distinguishes segments of stationary background noise from segments of speech, music, tonal-like signals, non-stationary noise, etc., to control the amount of energy smoothing. The energy smoothing factor $\beta_E$ is based on the detection of subframes of stationary background noise. The classification may appear as a regular VAD, however, the objective of the classification is distinctly different from the VAD. While the VAD is optimized so that speech is not miss-classified, the detection of stationary background noise is optimized so that stationary background noise is not to miss-classified. Occasional miss-classification of border cases of "non-stationary background noise" causes only minor degradation. Furthermore, the detection of stationary background noise is subframe based, and thus has slightly improved time resolution. Consequently, the detection of stationary background noise is significantly different from the VAD, and neither is capable of being substituted for the other.

The detection of stationary background noise is performed on a subframe basis and takes place in two steps. Initially, a detection based on the pitch pre-processed speech occurs. Next, the detection is refined using the residual signal after the adaptive codebook contribution is removed.

H. Initial Detection.

The initial detection is based on the pitch pre-processed speech, the VAD information, the pitch lag, and the 1$^{st}$ reflection coefficient (representing the tilt). Based on these parameters, Equations 90 through 97 are solved. The pitch correlation can be expressed as Equation 90.

$$R_{L_p} = \frac{\sum_{n=0}^{79} s(n) \cdot s(n - L_p)}{\sqrt{\left(\sum_{n=0}^{79} s(n)^2\right) \cdot \left(\sum_{n=0}^{79} (s(n - L_p))^2\right)}} \quad \text{(Equation 90)}$$

The running mean of pitch correlation can be expressed as Equation 91.

$$<R_{L_p}(n)> = 0.9 \cdot R_{L_p}(n-1) + 0.1 \cdot R_{L_p} \quad \text{(Equation 91)}$$

The maximum absolute signal amplitude in current pitch cycle can be expressed as Equation 92, $$\chi(k) = \max\{|s(n)|, n \in C_{pc}\} \quad \text{(Equation 92)}$$

where $C_{pc}$ is the set of samples belonging to the current pitch cycle. The accumulated absolute signal amplitudes can be expressed as Equation 93.

$$\psi(k) = \sum_{n \in C_{pc}} |s(n)| \quad \text{(Equation 93)}$$

The Signal to Noise Ratio of Maximum (SNRM) can be expressed as Equation 94, $$SNR_\chi(k) = \frac{\chi(k)}{<\chi_N(k)>}, \quad \text{(Equation 94)}$$

where $<\chi_N(k)>$ is a running mean of the maximum absolute signal amplitude of subframes that are predominantly stationary background noise. The absolute signal maximum in groups of 3 subframes can be expressed as Equation 95.

$$\chi_{g3}(k-j) = \max\{\chi(k-3\cdot j-2), \chi(k-3\cdot j-1), \chi(k-3\cdot j)\} \; j=4, 3, \ldots, 0 \quad \text{(Equation 95)}$$

The Steepest maximum evolution can be expressed as Equation 96.

$$\partial \chi_{g3}^{stp} = \frac{\chi_{g3}(k)}{\min\{\chi_{g3}(k-j), j=1,\ldots,4\}} \quad \text{(Equation 96)}$$

The linear maximum evolution (slope of MSE-fit to maximum in groups of 3 subframes) can be expressed as Equation 97.

$$\partial \chi_{g3}^{stp} = 0.1 \cdot \sum_{j=-4}^{0} \chi_{g3}(k+j) \cdot (j+2) \quad \text{(Equation 97)}$$

Based on the parameters given by Equation 91, 94 and the VAD information, the stationary background noise is detected. Furthermore, functionality to detect long-term decrease or increase in the background noise level and perform appropriate resets is based on the parameters calculated by Equations 90, 91, 94, 96 and 97. Finally, the update of the running mean of the maximum absolute signal amplitude of subframes that are predominantly stationary background noise are controlled by the parameters given by Equations 90, 91, and 94 and the reset information.

I. Refined Detection.

The refined detection is based on the parameters given by Equations 90 and 91, and the SNRM of Equation 94 with the exception that the refined detection is based on the pitch residual rather than the pre-processed speech and the initial detection.

J. Energy Smoothing Factor.

The energy smoothing factor $\beta_E$ is determined based on the refined detection process outlined below.

1. At the beginning of stationary background noise segments, the smoothing factor is preferably aramped quadractic from 0.0 to 0.7 over 4 subframes.
2. During stationary background noise segments the smoothing factor preferably is 0.7.
3. At the end of stationary background noise segments the smoothing factor is reduced to preferably 0.0 preferably instantaneously.
4. During non-"stationary background noise segments" the smoothing factor is preferably 0.0.

It should be noted, that although the energy smoothing is not performed during the Mode 1 operation, the energy smoothing factor module may still be executed to keep memories current.

K. Energy Normalization, Smoothing, and Correction.

This module modifies the target signal prior to the gain quantization to maintain the energy contour (smoothness) of noise-like segments and avoid the typical "waterfall" effect of CELP coding at especially low bit-rates. Preferably, the energy smoothing is directed towards segments of stationary background noise. The process estimates the unquantized gains, the smoothed open-loop and closed loop energies, the normalized gains and the new target signal for gain quantization.

L. Estimation of Unquantized Gains.

The unquantized gains are estimated in one of two ways depending on the normalized pitch correlation given by Equation 70. If the normalized pitch correlation is below approximately 0.6, the adaptive and fixed codebook gains are optimized jointly by minimizing the WMSE between the original reconstructed speech according to Equation 98.

$$\{g_a, g_c\} = \arg\min\left\{\sum_{n=0}^{79} (t(n) - ((g_a v_a(n) * h(n)) + (g_c v_c(n) * h(n))))^2\right\} \quad \text{(Equation 98)}$$

This results in the following estimates of the two gains:

$$g_a = \frac{R_{a,t} \cdot R_{c,c} - R_{a,c} \cdot R_{c,t}}{R_{a,a} \cdot R_{c,c} - R_{a,c} \cdot R_{a,c}} \quad \text{(Equation 99)}$$

and $$g_c = \frac{R_{c,t} - g_a R_{a,c}}{R_{c,c}}, \quad \text{(Equation 100)}$$

where $$R_{a,t} = \sum_{n=0}^{79} (v_a(n) * h(n)) \cdot t(n), \quad \text{(Equation 101)}$$

$$R_{c,t} = \sum_{n=0}^{79} (v_c(n) * h(n)) \cdot t(n),$$

$$R_{a,a} = \sum_{n=0}^{79} (v_a(n) * h(n))^2,$$

$$R_{c,c} = \sum_{n=0}^{79} (v_c(n) * h(n))^2,$$

$$R_{a,c} = \sum_{n=0}^{79} (v_a(n) * h(n)) \cdot (v_c(n) * h(n)).$$

If the normalized pitch correlation is above approximately 0.6, the adaptive and fixed codebook gains are disjointly optimized according to the WMSE between the original and reconstructed speech. For the adaptive codebook gain only the reconstruction from the adaptive codebook is considered, i.e., $$g_a = \operatorname{argmin}\left\{\sum_{n=0}^{79}(t(n) - (g_a v_a(n) * h(n)))^2\right\}, \quad \text{(Equation 102)}$$

and the gain is given by $$g_a = \frac{R_{a,t}}{R_{a,a}}. \quad \text{(Equation 103)}$$

In fact, the optimal WMSE pitch gain is already calculated during the adaptive codebook search, see Equation 68, and no re-calculation is required. Next, the fixed codebook gain is estimated according to Equation 104, $$g_c = \operatorname{argmin}\left\{\sum_{n=0}^{79}(t'(n) - (g_c v_c(n) * h(n)))^2\right\}, \quad \text{(Equation 104)}$$

where $$t'(n) = t(n) - (g_a v_a(n) * h(n)). \quad \text{(Equation 105)}$$

Preferably, the gain can be expressed as $$g_c = \frac{\sum_{n=0}^{79} t'(n) \cdot (v_c(n) * h(n))}{\sum_{n=0}^{79} (v_c(n) * h(n))^2} \quad \text{(Equation 106)}$$

Preferably, an objective of the disjoint optimization for highly voiced subframes is to avoid "coincidental" correlation between the target and the fixed codebook to artificially reduce the pitch gain and cause unnatural fluctuations in the pitch gain. The disjoint optimization may result in a slightly higher WMSE. However, the overall perceptual quality is improved.

M. Energy Smoothing.

The target energy of both the quantized excitation and reconstructed speech is estimated according to the smoothing factor $\beta_E$ derived during the analysis of the energy. The target energy of the quantized excitation (also referred as the open loop target energy) is given by Equation 107, $$\tilde{E}_e(k) = \beta_E \cdot \tilde{E}_e(k-1) + (1-\beta_E) \cdot \sum_{n=0}^{79} e(n)^2 \quad \text{(Equation 107)}$$

where e(n) is the residual signal. The target energy of the reconstructed speech (also referred as the closed loop target energy) is given by Equation 108.

$$\tilde{E}_s(k) = \beta_E \cdot \tilde{E}_s(k-1) + (1-\beta_E) \cdot \sum_{n=0}^{79} t(n)^2 \quad \text{(Equation 108)}$$

N. Energy Normalization.

Based on the smoothed open and closed loop energy targets, a open and a closed loop scaling factor for the codebook gains are estimated to match the energy targets. It should be noted that the smoothing is variable and may be zero. The open and closed loop scaling factors are given by Equations 109 and 110.

$$g_{ol} = 0.7 \cdot \sqrt{\frac{\tilde{E}_e(k)}{\sum_{n=0}^{79}(g_a \cdot v_a(n) + g_c \cdot v_c(n))^2}} \quad \text{bounded by } g_{ol} < \frac{1.2}{g_a} \quad \text{(Equation 109)}$$

$$g_{cl} = 0.7 \cdot \sqrt{\frac{\tilde{E}_e(k)}{\sum_{n=0}^{79}(g_a \cdot v_a(n) * h(n) + g_c v_c(n) * h(n))^2}}, \quad \text{(Equation 110)}$$

$$\text{bounded by } g_{cl} < \frac{1.2}{g_a}.$$

Based on the attenuation of the LPC filter given by Equation 111

$$g_{LPC}^{-1} = \sqrt{\frac{\sum_{n=0}^{79} e(n)^2}{\sum_{n=0}^{79} t(n)^2}}, \text{ bounded by } g_{LPC}^{-1} < 0.8 \quad \text{(Equation 111)}$$

and the detection of stationary background noise during the analysis of the energy contour, the final scaling factor $g_{scl}$ is determined as a linear combination of the open and closed loop scaling factors.

For subframes that are not stationary background noise, the final scaling factor is estimated according to Equation 112.

$$g_{scl} = \left(\frac{g_{LPC}^{-1}}{0.8}\right) \cdot g_{ol} + \left(1 - \frac{g_{LPC}^{-1}}{0.8}\right) \cdot g_{cl} \text{ bounded by } 1.0 < \quad \text{(Equation 112)}$$

$$g_{scl} < (1.0 + g_{LPC}^{-1})$$

Hence, when the prediction gain of the LP model is high (having a strong format structure) matching of the closed loop energy target is favored, and when the prediction gain of the LP model is low (having a flat spectral envelope) matching of the open loop energy target is favored. For stationary background noise subframes, the final scaling factor is estimated according to $$g_{scl} = \begin{cases} 1.1 \cdot g_{ol} & g_{cl} \leq g_{ol} \\ 1.1 \cdot g_{cl} & g_{cl} > g_{ol} \end{cases}, \quad \text{(Equation 113)}$$

where a weighting of the smaller of the two scaling factors is selected.

O. Energy Correction.

Based on the final scaling factor, the unquantized gains are modified according to Equation 114 and 115, $$g'_a = g_{scl} \cdot g_a, \quad \text{(Equation 114)}$$

$$g'_c = g_{scl} \cdot g_c, \quad \text{(Equation 115)}$$

and the target is corrected to Equation 116.

$$t(n) = g'_a \cdot v_a(n) * h(n) + g'_c \cdot v_c(n) * h(n) \quad \text{(Equation 116)}$$

The correction of the target artificially increases the correlation between the target signal and the filtered excitation vectors to avoid the typical energy fluctuations for waveform matching (CELP coders) of noise-like signals. This phenomenon may be caused by an erratic correlation between the target and the filtered excitation vectors caused by a low bit-rate excitation. It should be noted that without modifying the target prior to the gain quantization the energy normalization, smoothing, and correction have no effect.

P. Gain Quantization.

The adaptive and fixed codebook gains are jointly vector quantized with 7 bits per subframe similar to the method of G.729. The 2-dimensional codebook is searched exhaustively for the entry that minimizes the WMSE between the target given by Equation 116 and the reconstructed speech signal, i.e., minimizing Equation 117, $$E = \sum_{n=0}^{79} (t(n) - (\hat{g}_a v_a(n) * h(n) + \hat{g}_c v_c(n) * h(n)))^2 \quad \text{(Equation 117)}$$

where the quantized adaptive and fixed codebook gains are derived from the 7 bits codebook. The entries of the codebook contain the adaptive codebook gain and the correction factor for the predicted fixed codebook gain. The prediction of the fixed codebook gain is based on a $2^{nd}$ order MA prediction of the fixed codebook energy. The relation between the correction factor $\gamma_k$ and the quantized fixed codebook gain is given by Equation 118, $$\hat{g}_c = \gamma_k \cdot \tilde{g}_c, \quad \text{(Equation 118)}$$

where $\hat{g}_c$ is the quantized fixed codebook gain and $\tilde{g}_c$ is the predicted fixed codebook gain. The predicted fixed codebook gain is based on a $2^{nd}$ order MA prediction of the fixed codebook energy, and is given by Equation 119, $$\tilde{g}_c = 10^{\frac{1}{20}(\tilde{E}_k - E_e + \bar{E})} \quad \text{(Equation 119)}$$

where the $\bar{E}$=30 dB is the mean energy, $$E_c = 10 \, \log_{10}\left(\frac{1}{80} \sum_{n=0}^{79} v_c(n)^2\right), \quad \text{(Equation 120)}$$

and $\tilde{E}_k$ is defined by Equation 121.

$$\tilde{E}_k = \sum_{i=1}^{2} b_i \cdot (20 \log_{10} \gamma_{k-i}). \quad \text{(Equation 121)}$$

The prediction coefficients of the MA prediction are $\{b_1, b_2\} = \{0.6, 0.3\}$.

11. Mode 1 Processing

Figure 6:
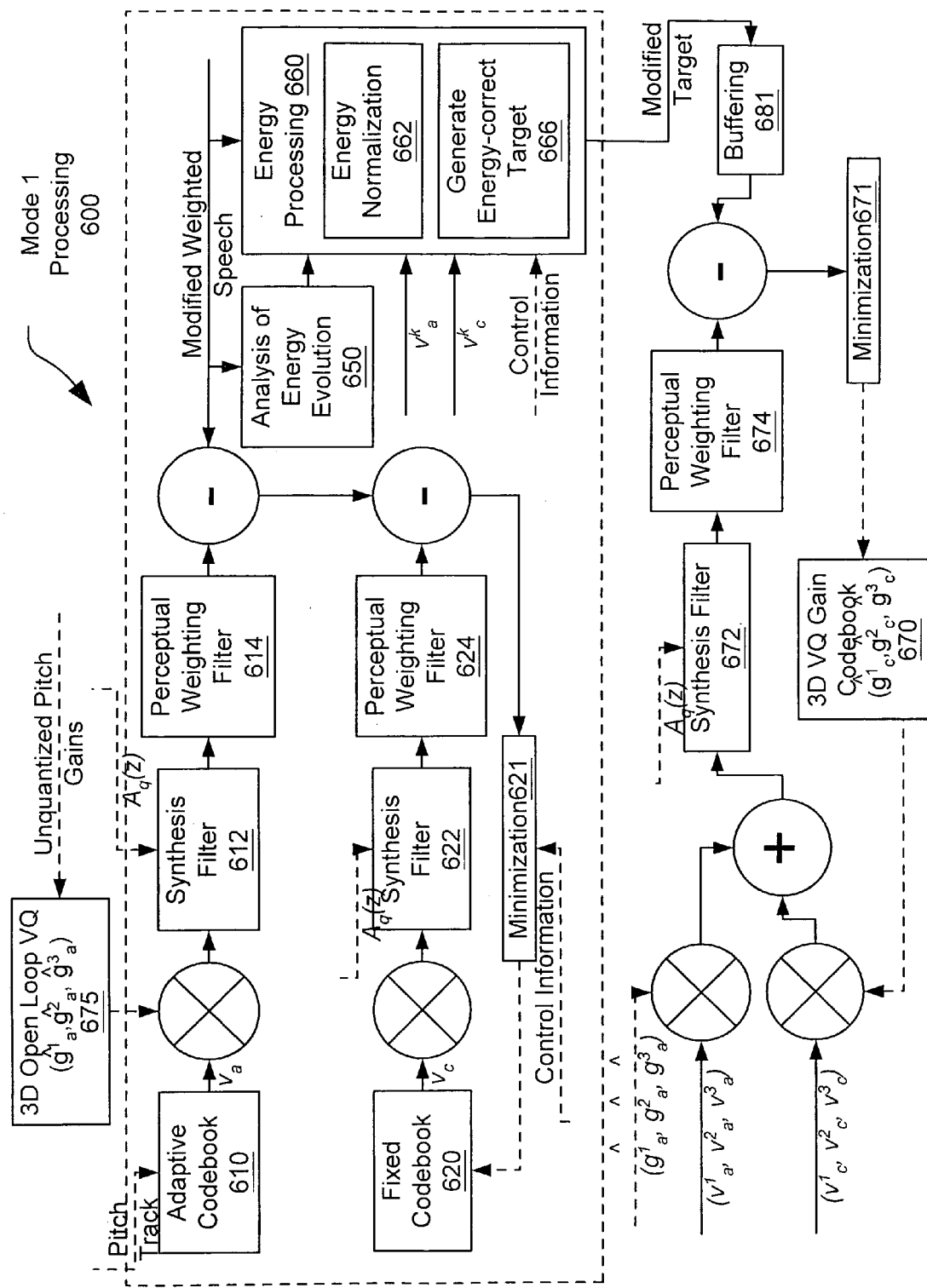
FIG. 6 is a block diagram of a Mode one speech coding system.

In Mode 1 the signal encoding proceeds according to the mode optimized for "periodic"-like signals. In Mode 1 a frame is divided into three subframes. Referring to FIG. 6, the processing within the dotted box is executed on a subframe basis with the index k denoting the subframe number. The remaining functions (outside the dotted box) are executed on a frame basis. Accordingly, a Mode 1 process can require buffering parameters for three subframes at the boundary between subframe and frame based processing, e.g., the pre-quantized pitch gains, quantized adaptive and fixed codebook vectors, target vector, etc.

As shown in FIG. 6, a pitch track is provided to an adaptive codebook 610. In addition, unquantized pitch gains are provided to a three dimensional (3D) open loop vector quantization (VQ) block 675 and a code-vector, shown as $v_a$, is generated by the adaptive codebook 610. After the code-vector $v_a$ passes through a gain stage that also receives input from the 3D open loop VQ block 675, the amplified code vector is fed into a synthesis filter 612. The output of the synthesis filter 612 is passed through a perceptual weighting filter 614 and on to a first summing junction that also receives input from a modified weighted speech. The modified weighted speech is also passed to an analysis of energy evolution block 650 and an energy processing block 660. The energy processing block 660 itself comprises an energy normalization block 662, and a generate energy-correct target block 666.

A fixed codebook 620 provides a code-vector, shown as $v_c$, to a gain stage and then to a synthesis filter 622. The output of the synthesis filter 622 is passed through a perceptual weighting filter 624 and then to the second summing junction. The output of the second summing junction is fed to a minimization block 621 that is used to modify selection within the fixed codebook 620. Control information is also provided to the minimization block 621.

In addition, two additional gain stages each provide input to a third summing junction, and the output from the third summing junction is passed to a synthesis filter 672. The output of the synthesis filter 672 is passed through a perceptual weighting filter 674 and on to a fourth summing junction that receives input from the energy processing block 660 through a modified target signal. A buffering block 681 shows that the modified target signal is operable to be buffered for the three subframes before being passed to the fourth summing junction. Control information and the code-vectors $v^k_a$ and $v^k_c$ are used to generate the modified target signal. The output from the fourth summing junction is received by a minimization block 671 that generates a signal that is received by a three dimensional (3D) vector quantization (VQ) gain codebook 670. The output from the 3D VQ gain codebook 670 is provided to the fourth gain stage.

A. 3D Open Loop VQ of Pitch Gains.

The 3 pitch gains derived during the pitch pre-processing are quantized open loop with a 4 bits 3-dimensional vector quantizer according to Equation 122.

$$\{\hat{g}_a^1, \hat{g}_a^2, \hat{g}_a^3\} = arg\ min\left\{\left(\sum_{i=1}^{3}(g_a^i - \hat{g}_a^i)^2\right),\right.$$
$$\left.\{\hat{g}_a^i, \hat{g}_a^2, \hat{g}_a^3\} \in \{\{\hat{g}_a^{1,i}, \hat{g}_a^{l,2}, \hat{g}_a^{l,3}\}, l = 0, 1, \ldots, 15\}\right\}$$

(Equation 122)

The low bit-rate is justified by the stable behavior of the pitch gains in Mode 1. The quantization is performed on a frame basis prior to any subframe processing.

B. Adaptive Codebook Contribution.

The adaptive codebook contribution is derived from the past excitation and the pitch track specified by the pitch pre-processing. Thus, an initial search of the adaptive codebook is not required. According to the interpolated pitch track $L_p(n)$ from the pitch pre-processing, each sample value of the adaptive codebook excitation is obtained by interpolation of the past excitation using a $21^{st}$ order Hamming weighted Sinc window as shown in Equation 123, $$v_a(n) = \sum_{i=-10}^{10} w_s(f(L_p(n)), i) \cdot e(n - i(L_p(n)))$$

(Equation 123)

where e(n) is the past excitation, $i(L_p(n))$ and $f(L_p(n))$ is the integer and farctional part of the pitch lag, respectively, and $w_s(f,i)$ is the Hamming weighted Sinc window. An optimal WMSE pitch gain is estimated by Equation 124

$$g = \frac{\sum_{n=0}^{N-1} t(n) \cdot (v_a(n) * h(n))}{\sum_{n=0}^{N-1} (v_a(n) * h(n))^2},\ \text{bounded by } 0.0 \le g \le 1.2$$

(Equation 124)

to minimize the WMSE between the original and reconstructed speech signal. Note that N in Equation 124 is the variable subframe size.

The unquantized pitch gain is calculated according to a weighting of the optimal pitch gain expressed in Equation 125, $$g_a = \left(\frac{1}{2}R_n + \frac{1}{2}\right) \cdot g,$$

(Equation 125)

where the normalized cross-correlation is derived by Equation 126.

$$R_n = \frac{\sum_{n=0}^{N-1} t(n) \cdot (v_a(n) * h(n))}{\sqrt{\left(\sum_{n=0}^{N-1} t(n)^2\right) \cdot \left(\sum_{n=0}^{N-1} (v_a(n) * h(n))^2\right)}}.$$

(Equation 126)

This weighting de-emphasizes the pitch contribution from the adaptive codebook prior to the fixed codebook search, leaving more of the pitch information in the target signal for the fixed codebook search. Note that the gain calculation of Equation 124, 125, and 126 are similar to Equations 68, 69, and 70 of the adaptive codebook search in Mode 0.

C. Fixed Codebook Search.

The fixed codebook excitation is represented with 13 bits per subframe in Mode 1. The codebook has three sub pulse codebooks. Preferably, the 2-pulse codebook has 4096 entries, the 3-pulse codebook has 2048 entries, and the 6 pulse codebook has 2048 entries. This number of entries sums to a total of 8192 entries that can be addressed by 13 bits. Weighting of the WMSE of the different sub codebooks is applied to favor the excitation most suitable to achieve the highest perceptual quality.

The initial target for the fixed codebook is calculated from the weighted pre-processed speech with the zero-response removed, i.e., the target for the adaptive codebook, and the optimal adaptive codebook excitation and gain according to Equation 127 which is equivalent to Equation 71 of Mode 0.

$$t'(n) = t(n) - g_a \cdot (v_a(n) * h(n)).$$

(Equation 127)

Like Mode 0, the perceptual weighting for the search of the fixed codebook is adapted according to the instantaneous Noise to Signal Ratio (NSR) by an adaptive $1^{st}$ order filter, as seen in Equations 72 and 73 This results in a modified target and synthesis filter response denoted by t"(n) and h"(n), respectively.

Like the fixed codebook search of Mode 0, the fixed codebook search of Mode 1 builds characteristics into the excitation signal by modifying the filter response. However, the phase dispersion filter of Mode 0 is omitted and only the incorporation of the most significant correlation of the recent past is included in this mode. This procedure was described by Equation 75 through 79. Note that the fixed subframe size of Mode 0 in Equations 75 through 79 may be substituted for the variable subframe size of Mode 1. The response of the synthesis filter (like Equation 79) for the search of the pulse codebooks is defined by Equation 128.

$$h_1(n) = h_{c2} * (h_{c1} * h''(n))  \quad \text{(Equation 128)}$$

In contrast to Mode 0, Mode 1 applies the traditional forward pitch enhancement by modifying the impulse response of the synthesis filter according to Equation 129, $$h_2(n) = h_{pe}(n) * h_1(n) \quad \text{(Equation 129)}$$

where the pitch enhancement filter is given by Equation 130.

$$h_{pe}(n) = \begin{cases} g_{pe} & n = l_{pe} \\ 0 & n \neq l_{pe}, \end{cases} \quad \text{(Equation 130)}$$

D. 2-Pulse Codebook

The 2-pulse codebook is searched in a closed-loop to minimize the perceptually weighted mean-squared error between the original and the reconstructed speech. The MSE between the candidate excitation convoluted with the weighted response of the synthesis filter expressed by Equation 129 and the target t"(n) is minimized according to Equation 131, $$c_{2p}(n) = \arg\max \left\{ \frac{\left(\sum_{n=0}^{N-1} t''(n) \cdot (c_{2p}(n) * h_2(n))\right)^2}{\sum_{n=0}^{N-1} (c_{2p}(n) * h_2(n))^2}, \right.$$

$$\left. c_{2p}(n) \in \{c_{2p}^l(n), l = 0, \ldots, 4095\} \right\} \quad \text{(Equation 131)}$$

where $c_{2P}^l(n), l=0, \ldots, 4095$ are the candidate excitation vectors from the 2-pulse codebook, and $c_{2P}(n)$ is the best candidate. The pitch enhancement parameters of Equation 130 are $$l_{pe} = \begin{cases} L_p & L_p < N \\ \frac{1}{2}L_p & L_p \geq N, \end{cases} \quad \text{(Equation 132)}$$

and $$g_{pe} = \begin{cases} \hat{g}_a & L_p < N \\ \min\{0.2 \cdot \hat{g}_a, 0.2\} & L_p \geq N, \end{cases} \quad \text{(Equation 133)}$$

where $L_p$ is the integer lag at the center of the subframe and N is the variable subframe size.

Each pulse is preferably restricted to a track where 5 bits specify track position, and 1 bit specifies the sign of the pulse. This is equivalent to a total of 12 bits (4096 entries). The tracks for the 2 pulses can be expressed as $T_{p1}$ and $T_{p2}$ can be expressed as:

$T_{p1}$:

{0,1,2,3,4,5,6,7,8,9,10,12,14,16,18,20,22,24,26,28,30,32, 34,36,38,40,42,44,46,48,50,52}

$T_{p2}$:

{1,3,5,7,9,11,12,13,14,15,16,17,18,19,20,21,22,23,25,27, 29,31,33,35,37,39,41,43,45,47,4 9,51}

Each track preferably has 32 pulse positions that can be addressed by 5 bits. Preferably, a reduced complexity search is applied to maintain low complexity.

E. 3-Pulse Codebook.

The 3-pulse codebook is searched in a closed-loop to minimize the perceptually weighted mean-squared error between the original and the reconstructed speech signal. The MSE between the candidate excitation convoluted with the weighted response of the synthesis filter given by Equation 129 and the target t"(n) is minimized according to Equation 134.

$$c_{3p}(n) = \arg\max \left\{ \frac{\left(\sum_{n=0}^{N-1} t''(n) \cdot (c_{3p}(n) * h_2(n))\right)^2}{\sum_{n=0}^{N-1} (c_{3p}(n) * h_2(n))^2}, \right.$$

$$\left. c_{3p}(n) \in \{c_{3p}^l(n), l = 0, \ldots, 2047\} \right\}, \quad \text{(Equation 134)}$$

where $c_{3P}^l(n), l=0, \ldots, 2047$ are the candidate excitation vectors from the 3-pulse codebook, and $c_{3P}(n)$ is deemed the best candidate. The pitch enhancement parameters of Equation 130 are $$l_{pe} = \begin{cases} L_p & L_p < N \\ \frac{1}{2}L_p & L_p \geq N, \end{cases} \quad \text{(Equation 135)}$$

and $$g_{pe} = \begin{cases} 0.5 \cdot \hat{g}_a & L_p < N \\ \min\{0.2 \cdot \hat{g}_a, 0.2\} & L_p \geq N, \end{cases} \quad \text{(Equation 136)}$$

where $L_p$ is the integer lag at the center of the subframe and N is the variable subframe size. The 3-pulse codebook is constructed by a specification of an absolute point by 3 bits (from a track of 8 positions) and the position of each of the three pulses relative to the absolute point with either 1 or 2 bits and a 1 bit sign. This sum of bits 3+(2+2+1)+3=11 bits is equivalent to 8192 entries. The track for the absolute point is expressed below.

$T_{abs}$: {0,6,12,18,24,30,36,43}, and the relative tracks for the 3 pulse are shown as $\Delta T_{p1}$, $\Delta T_{p2}$, and $\Delta T_{p3}$.

$\Delta T_{p1}$: {2,4,6,8}

$\Delta T_{p2}$: {1,3,5,7}

$\Delta T_{p3}$: {0,9}

Preferably, a reduced complexity search is applied to maintain low complexity.

F. 6-Pulse Codebook.

The 6-pulse codebook is searched in a closed-loop to minimize the perceptually weighted mean-squared error between the original and the reconstructed speech signal. The MSE between the candidate excitation convoluted with the weighted response of the synthesis filter given by Equation 129 and the target t''(n) is minimized according to Equation 137, $$c_{6p}(n) = \arg\max\left\{\frac{\left(\sum_{n=0}^{N-1} t''(n) \cdot (c_{6p}(n) * h_2(n))\right)^2}{\sum_{n=0}^{N-1} (c_{6p}(n) * h_2(n))^2},\right.$$

$$\left. c_{6p}(n) \in \{c_{6p}^l(n), l = 0, \ldots, 2047\}\right\} \quad \text{(Equation 137)}$$

where $c_{6P}^l(n), l=0, \ldots, 2047$ are the candidate excitation vectors from the 6-pulse codebook, and $c_{6P}(n)$ is deemed the best candidate. The pitch enhancement of the 3-pulse codebook is preferably used, see Equation 135 and 136.

Each of the pulses are restricted to a track. The tracks of the first 5 pulses have 2 positions and the last track has 1 position. The sign of each pulse is specified with 1 bit. This is equivalent to a total of 11 bits or to 2048 entries. The tracks for 6 pulses may be given by $T_{p1}$, $T_{p2}$, $T_{p3}$, $T_{p4}$, $T_{p5}$, and $T_{p6}$.

$T_{p1}$: {0,5}

$T_{p2}$: {9,14}

$T_{p3}$: {18,23}

$T_{p4}$: {27,32}

$T_{p5}$: {36,41}

$T_{p6}$: {46}

Again, a reduced complexity search may be used to simplify the search.

G. Final Selection.

The selection of the final fixed codebook excitation preferably compares the WMSE of the best candidate from each of the three sub codebooks after applying appropriate weighting according to the classification information. The modifications of the excitation described by Equation 128 and the pitch enhancement (Equation 129) are incorporated into the excitation. The final fixed codebook excitation is denoted $\vec{v}_c$ or $v_c(n)$.

H. Energy Normalization and Correction

The Energy Normalization, Smoothing, and Correction module is similar to the Energy Normalization, Smoothing, and Correction described for Mode 0. However, it is also different Mode 1 energy smoothing is not performed because Mode 1 does not encounter segments of stationary background noise. Furthermore, only the fixed codebook contribution is considered since the adaptive codebook gain was previously quantized. The process involves estimating the unquantized fixed codebook gain, the open-loop and closed loop energies, the normalized gains and the new target signal for the gain quantization.

I. Estimation of Unquantized Gains.

Since the adaptive codebook gain is already quantized, only the unquantized fixed codebook gain needs to be estimated. It is estimated to minimize the WMSE between the original speech signal and the reconstructed speech signal according to Equation 138, $$g_c = \arg\min\left\{\sum_{n=0}^{N-1} (t'(n) - (g_c v_c(n) * h(n))^2\right\}, \quad \text{(Equation 138)}$$

where $$t'(n)=t(n)-(\hat{g}_a v_a(n)*h(n)). \quad \text{(Equation 139)}$$

The gain is given by $$g_c = \frac{\sum_{n=0}^{N-1} t'(n) \cdot (v_c(n) * h(n))}{\sum_{n=0}^{N-1} (v_c(n) * h(n))^2}. \quad \text{(Equation 140)}$$

J. Energy Estimation

The target energy of the quantized excitation (also referred as the open loop target energy) can be expressed by Equation 141, $$E_e = \sum_{n=0}^{N-1} e(n)^2, \quad \text{(Equation 141)}$$

where e(n) is the residual signal. The target energy of the reconstructed speech (also referred to as the closed loop target energy) is expressed by Equation 142.

$$E_s = \sum_{n=0}^{N-1} t'(n)^2, \quad \text{(Equation 142)}$$

where t'(n) is expressed by Equation 139.

K. Energy Normalization

Based on the smoothed open and closed loop energy targets, a open and closed loop scaling factor for the codebook gains are estimated to match the energy targets. The open and closed loop scaling factors may be expresses as:

$$g_{ol} = \sqrt{\frac{E_e}{\sum_{n=0}^{79} (g_c \cdot v_c(n))^2}}, \quad \text{(Equation 143)}$$

and $$g_{cl} = \sqrt{\frac{E_s}{\sum_{n=0}^{79}(g_c \cdot v_c(n) * h(n))^2}}.$$  (Equation 144)

Based on the attenuation calculated by Equation 145, $$g^{-1} = 0.75 \cdot \sqrt{\frac{\sum_{n=0}^{79} e(n)^2}{\sum_{n=0}^{79} t'(n)^2}}$$  (Equation 145)

the final scaling factor $g_{scl}$ is determined through a linear combination of the open and closed loop scaling factors according to Equation 146.

$$g_{scl} = \frac{1}{2}(g^{-1} \cdot g_{ol} + (1 - g^{-1}) \cdot g_{cl}),$$  (Equation 146)

bounded by $1.0 < g_{scl} < (1.0 + g^{-1})$.

Like Mode 0, closed loop scaling is favored for non-flat signals and open-loop scaling is favored for flat signals.

L. Energy Correction.

If the signal to background noise ratio is below 12 dB, the unquantized fixed codebook gain is modified according to Equation 147, $$g'_c = g_{scl} \cdot g_c$$  (Equation 147)

based on the final scaling factor. If the signal to background noise ratio is above 12 dB the energy correction is not performed and the unquantized fixed codebook gain is not modified.

$$g'_c = g_c.$$  (Equation 148)

The target is corrected according to Equation 149.

$$t(n) = \hat{g}_a(n)v_a(n)*h(n) + g'_c(n)v_c(n)*h(n).$$  (Equation 149)

The correction of the target artificially increases the correlation between the target signal and the filtered excitation vectors, avoiding the typical energy fluctuations for waveform matching (CELP coders) of noise-like signals. This phenomenon is typically caused by erratic correlation between the target and the filtered excitation vectors due to low bit-rate excitation. However, as opposed to Mode 0, the adaptive codebook contribution is not affected. Consequently, only the fixed codebook contribution is affected.

M. 3D VQ of Fixed Codebook Gains.

The subframe processing of Mode 1 is performed with unquantized fixed codebook gains. The excitation signals, target signals, quantized adaptive codebook gains are buffered during the subframe processing and used to perform delayed joint quantization of the three fixed codebook gains with an 8 bits vector quantizer.

The delayed quantization introduces an error during the subframe processing since the past excitation for the $2^{nd}$ and $3^{rd}$ subframe is not fully quantized, i.e., the adaptive codebook is not correct. However, the error appears to be negligible. To fully synchronize encoder and decoder as well as to correctly update the filter memories, the synthesis for all subframes are repeated with fully quantized parameters once the delayed vector quantization of the three fixed codebook gains is complete. The 3-dimensional codebook is searched to minimize E, $$E = \sum_{n=0}^{52}\left(t^1(n) - (\hat{g}_a^1 v_a^1(n)*h(n) + \hat{g}_c^1 v_c^1(n)*h(n))\right)^2$$  (Equation 150)
$$+ \sum_{n=0}^{52}\left(t^2(n) - (\hat{g}_a^2 v_a^2(n)*h(n) + \hat{g}_c^2 v_c^2(n)*h(n))\right)^2,$$
$$+ \sum_{n=0}^{53}\left(t^3(n) - (\hat{g}_a^3 v_a^3(n)*h(n) + \hat{g}_c^3 v_c^3(n)*h(n))\right)^2$$

where the quantized pitch gains $\{\hat{g}_a^1, \hat{g}_a^2, \hat{g}_a^3\}$ originate from the original frame based processing, and $\{t^1(n), t^2(n), t_3(n)\}$, $\{v_a^1(n), v_a^2(n), v_a^3(n)\}$, and $\{v_c^1(n), v_c^2(n), v_c^3(n)\}$ are buffered during the subframe processing.

The fixed codebook gains $\{\hat{g}_c^1, \hat{g}_c^2, \hat{g}_c^3\}$ are derived from an 8 bits codebook where the entries of the codebook contain a 3-dimensional correction factor for the predicted fixed codebook gains. The prediction of the fixed codebook gains is based on MA prediction of the fixed codebook energy. The relation between the correction factors $\gamma_k^j$ and the quantized fixed codebook gains is given by Equation 151, $$\hat{g}_c^j = \gamma_k^j \cdot \tilde{g}_c^j,$$  (Equation 151)

where $\hat{g}_c^j$ is the quantized fixed codebook gain and $\tilde{g}_c^j$ is the predicted fixed codebook gain of the $j^{th}$ subframe of frame k. The predicted fixed codebook gains is based on MA prediction of the fixed codebook energy, and it is given by Equation 152, $$\tilde{g}_c^j = 10^{\frac{1}{20}(\tilde{E}_k^j + \bar{E} - E_c^j)}$$  (Equation 152)

where the $\bar{E}=34$ dB is the mean energy, and $$E_c^j = 10\log_{10}\left(\frac{1}{N}\sum_{n=0}^{N-1} v_c^j(n)^2\right),$$  (Equation 153)

and $$\tilde{E}_k^j = \sum_{i=j}^{3} b_i \cdot (20\log_{10}\gamma_{k-1}^{4-i}).$$  (Equation 154)

The prediction coefficients of the MA prediction are $\{b_1, b_2, b_3\} = \{0.6, 0.3, 0.1\}$. The prediction of the energy from further back has greater leakage to accommodate the greater uncertainty associated with the prediction. This applies to the 2 and 3 subframe where the most recent history is not yet available due to the joint quantization.

An alternative and better method has been developed. This method applies $3^{rd}$ order MA prediction of the energies for all 3 subframes, and thus, does not use only $2^{nd}$ order and $1^{st}$ order MA prediction for the second and third subframe, respectively.

Instead, the additional leakage for the second and third subframe is introduced by having 3 different predictors. The prediction equivalent to Equation 154 is can be expressed by Equation 155, $$\tilde{E}_k^j = \sum_{i=1}^{3} b_{j,i} \cdot (20 \log_{10} \gamma_{k-1}^{4-i}), \quad \text{(Equation 155)}$$

where the predictor coefficients are $$\{b_{j,1}, b_{j,2}, b_{j,3}\} = \quad \text{(Equation 156)}$$
$$\begin{cases} \{0.6, 0.30, 0.100\} & j = 1 (1^{st} \text{ subframe}) \\ \{0.4, 0.25, 0.100\} & j = 2 (2^{nd} \text{ subframe}) \\ \{0.3, 0.15, 0.075\} & j = 3 (3^{rd} \text{ subframe}) \end{cases}.$$

Consequently, the prediction of the energies of the 3 subframes is based on the same past memory. This method provides a more stable prediction error with less fluctuation and outliers improving the accuracy of the quantization.

12. Decoder

Figure 7:
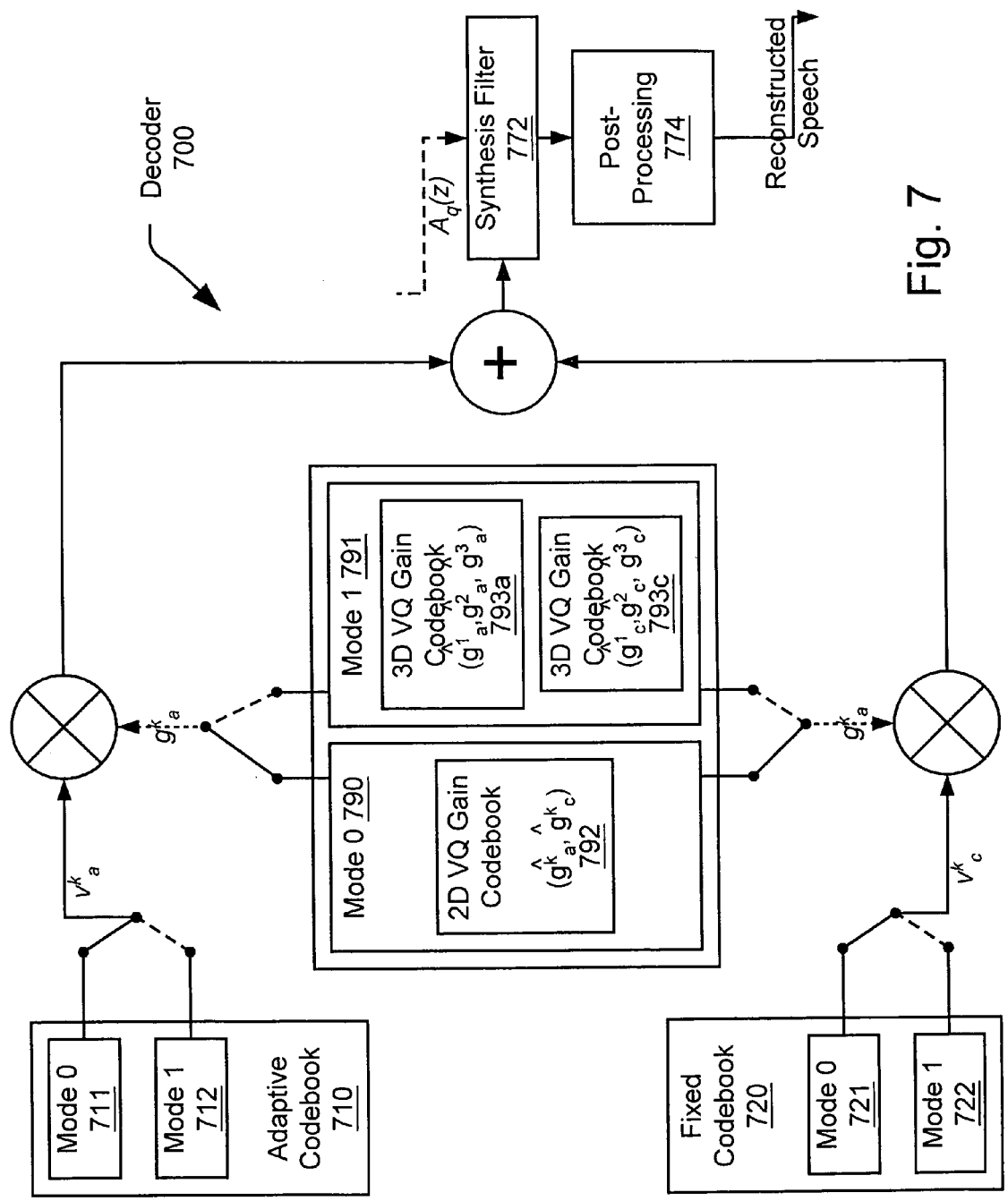
FIG. 7 is a block diagram of a decoder.

A block diagram of the decoder 700 is shown in the FIG. 7. Decoder 700 is based on an inverse mapping of the bit-stream to the method parameters followed by synthesis according to the mode decision. The synthesis is similar for both modes. The differentiating factor is the number of subframes and the decoding of the parameters (excitation vectors and gains) from the bit stream.

The decoder comprises an adaptive codebook 710 and a fixed codebook 720 as shown in FIG. 7. An adaptive codebook 710 is operable with both a Mode 0 711 and a Mode 1 712. Similarly, a fixed codebook 720 is operable with both a Mode 0 721 and a Mode 1 722. A code-vector is provided from the adaptive codebook 710, shown as $v^k_a$, to a first gain stage. Similarly, a code-vector is provided from the fixed codebook 720, shown as $v^k_c$, to a second gain stage. The gains by which the first gain stage and the second gain stage operate are controlled by a common block that is operable at a Mode 0 790 and a Mode 1 791. The Mode 0 block 790 contains a two dimensional (2D) vector quantization (VQ) gain codebook 792 that is operable to provide both adaptive and fixed gain control. The Mode 1 block 791 contains a three dimensional (3D) vector quantization (VQ) gain codebook 793*a* and a three dimensional (3D) vector quantization (VQ) gain codebook 793*c*. The 3D VQ gain codebook 793*a* is operable to provide the gains for the adaptive codebook, and the 3D VQ gain codebook 793*c* is operable to provide the gains for the fixed codebook.

The outputs from the first gain stage and the second gain stage are each fed to a summing junction, and the output from the summing junction received by a synthesis filter 772. The output from the synthesis filter 772 is received by a post-processing block 774 from which a reconstructed speech signal is provided. The operation of all blocks of the decoder has been described above except for a frame erasure concealment and a post processing.

The decoder initially checks for frame erasure by checking the synchronization word. If the frame is declared "good" the regular decoding proceeds (as given by the encoder). If the frame is declared "bad" the erasure concealment is activated. It is performed on the parameter level similar to G.729.

13. Frame Erasure Concealment

The frame erasure concealment is performed on a parameter level. This involves predicting the Mode, the LPC synthesis filter, the pitch track, the fixed codebook excitation, and the adaptive and fixed codebook gains, and from the predicted parameters synthesize the speech of the erased frame.

A. Mode.

The mode is predicted as the previous mode. This is based on the observation that adjacent frames often are in the same mode.

B. LPC synthesis filter

The prediction of the LPC filter is based on the LSFs. The LSFs are estimated as the previous LSFs shifted slightly towards the mean, i.e., $$\underline{\mathit{lsf}}_n = 0.9 \cdot \underline{\mathit{lsf}}_{n-1} + 0.1 \cdot \langle \underline{\mathit{lsf}} \rangle, \quad \text{(Equation 157)}$$

where $\langle \underline{\mathit{lsf}} \rangle$ is the mean (fixed) of the LSFs, and $$\underline{\mathit{lsf}}_{n-1}$$

and $$\underline{\mathit{lsf}}_n$$

are the reconstructed LSFs of the past and current frame, respectively. The memory for the MA predictor is updated with a weighted average of the past 4 updates according to $$\hat{\Delta}_n^{lsf} = 0.5 \cdot \frac{1}{4} \cdot \sum_{l=1}^{4} \hat{\Delta}_{n-l}^{lsf} \quad \text{(Equation 158)}$$

During the frames following a frame erasure the gain of the LPC filter is closely monitored in order to detect abnormal behavior.

C. Pitch track

For Mode 0 the pitch lag of the first subframe, $L_n(0)$, is set to the pitch lag of the second subframe of the previous frame, $L_{n-1}(1)$, and for the second subframe the pitch lag, $L_n(1)$, is incremented by 1, i.e., $$L_n(0) = L_{n-1}(1), \quad \text{(Equation 159)}$$

$$L_n(1) = L_n(0) + 1. \quad \text{(Equation 160)}$$

For Mode 1 the pitch track interpolation is based on the previous pitch lags used for the pitch interpolation according to $$L_n^{start} = L_{n-1}^{end}, \quad \text{(Equation 161)}$$

$$L_n^{end} = L_{n-1}^{end}. \quad \text{(Equation 162)}$$

Based on the pitch lag information the adaptive codebook contribution is derived as in the encoder.

D. Fixed Codebook Excitation.

For Mode 0 a random entry from the Gaussian sub codebook is selected. The signs and the entries for the two basis vectors are generated with a pseudo random number generator. For Mode 1 a random entry from the 6-pulse codebook is selected. Alternatively, a randomly selected Gaussian excitation vector (as for Mode 0) could be used.

E. Adaptive and Fixed Codebook Gains.

For Mode 0 the adaptive and fixed codebook gains are gradually decreased according to Equations 163 and 164, $$\hat{g}_{a,n} = \alpha_{a,i} \cdot \hat{g}_{a,n-1} \quad \text{(Equation 163)}$$

and $$\hat{g}_{c,n} = \alpha_{c,i} \cdot \sqrt{\frac{\sum_{i=0}^{79}(\hat{g}_{c,n-1} v_{c,n-1}(i))^2}{\sum_{i=0}^{79} v_{c,n-1}(i)^2}}, \quad \text{(Equation 164)}$$

where the scaling factors are given by Equations 165 and 166.

$$\alpha_{a,i} = \begin{cases} 0.98 & i \leq 6 \\ 0.70 & i > 6 \end{cases} \quad \text{(Equation 165)}$$

and $$\alpha_{c,i} = \begin{cases} 0.98 & i \leq 3 \\ 0.80 & i = 4 \\ 0.30 & i = 5 \\ 0.20 & i > 6 \end{cases} \quad \text{(Equation 166)}$$

The index i in Equation 163, 164, 165, and 166 specifies the number of consecutive frame erasures, and the index n in Equation 163 and 164 represents the running subframe number.

The energy of the complete fixed codebook excitation is scaled down (as opposed to simply scaling the fixed codebook gain) in order to better control the energy evolution or change during frame erasures. For Mode 1 the adaptive and fixed codebook gains are quantized separately. The estimation of the adaptive codebook gain is given by Equation 167, $$\hat{g}_{a,n} = \alpha_{a,i} \cdot \max\left\{\left(\frac{1}{3}\sum_{i=1}^{3} \hat{g}_{a,n-i}\right), \hat{g}_{a,n-1}\right\} \quad \text{(Equation 167)}$$

where the scaling factor is $$\alpha_{a,i} = \begin{cases} 0.98 & i = 1 \\ 0.96 & 1 < i \leq 6 \\ 0.70 & i > 6 \end{cases} \quad \text{(Equation 168)}$$

The fixed codebook gain is preferably estimated according to Equations 164 and 166, except that the down scaling for the first subframe of the first frame ersures is 1.0 as opposed to 0.98. The index n in Equation 167 represents the running subframe number.

14. Post Processing

The post processing is similar to the main body of G.729 except that the short-term post filter given by the following equation:

$$H_{st}(z) = \frac{\hat{A}\left(\frac{z}{\gamma_{1,n}}\right)}{\hat{A}\left(\frac{z}{\gamma_2}\right)} \quad \text{(Equation 169)}$$

is adapted according to the background noise level. The adaptation is introduced by making $\gamma_{1,n}$ a function of the signal to background noise ratio (estimated at the decoder) $\zeta_{dec}$ according to Equation 170.

$$\gamma_{1,n} = \begin{cases} \gamma_{1,n-1} - 0.025 \text{ bounded by } \gamma_{1,n} > 0.57, & \zeta_{dec} > 12\text{dB} \\ \gamma_{1,n-1} + 0.025 \text{ bounded by } \gamma_{1,n} > 0.75, & \zeta_{dec} \leq 12\text{dB} \end{cases} \quad \text{(Equation 170)}$$

Consequently, during noisy segments the short-term post filter converges towards a flat filter (disable short-term post filter), and during "clean" segments it converges towards the short-term post filter of G.729. The weighting factor $\gamma_{1,n}$ is updated on a subframe basis.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A speech compression system for processing a speech signal, the speech compression system comprising:
   a mode selection module configured to select one of a first framing structure and a second framing structure for encoding parameters of a frame of the speech signal; and
   a prediction module configured to predict a fixed codebook characteristic for each of a plurality of subframes when the second framing structure is selected, the prediction module is further configured to predict the fixed codebook characteristic as a function of prediction coefficients associated with each subframe and a fixed codebook characteristic from each of plurality of subframes of a previous frame;

wherein a fixed codebook gain for each of the subframe is represented with respective predicted fixed codebook characteristic when the second framing structure is selected;

wherein the speech compression system derives a pitch gain for each of a plurality of subframes during pitch pre-processing, quantizes the pitch gain of each of the subframes, and performs a delayed joint quantization of the fixed codebook gains for each of the subframes as a function of the stored quantized pitch gain of each of the subframes.

2. The speech compression system of claim 1, wherein the first framing structure has a first bit allocation and the second framing structure has a second bit allocation, wherein the first bit allocation is different than the second bit allocation, and wherein each of the first bit allocation and the second bit allocation includes a bit allocation indicative of the selected framing structure.

3. The speech compression system of claim 1, wherein the prediction module applies a third order moving average prediction.

4. The speech compression system of claim 1, wherein the prediction coefficients comprise a first subframe predictor coefficient represented as {0.6, 0.3, 0.1}, a second subframe predictor coefficient represented as {0.4, 0.25, 0.1}, and a third subframe predictor coefficient represented as {0.3, 0.015, 0.075}.

5. The speech compression system of claim 1, wherein the fixed codebook characteristic comprises fixed codebook energy.

6. The speech compression system of claim 1, wherein a fixed codebook characteristic for each of a plurality of subframes is not predicted when the first framing structure is selected, and wherein a fixed codebook gain for each of the subframe is not represented with respective predicted fixed codebook characteristic when the first framing structure is selected.

7. A method of processing a speech signal, the method comprising:

selecting one of a first framing structure and a second framing structure for encoding parameters of a frame of the speech signal;

predicting a fixed codebook characteristic for each of a plurality of subframes when the second framing structure is selected, wherein the predicting is performed as a function of prediction coefficients associated with each subframe and a fixed codebook characteristic from each of plurality of subframes of a previous frame;

representing a fixed codebook gain for each of the subframe with respective predicted fixed codebook characteristic when the second framing structure is selected;

deriving a pitch gain for each of a plurality of subframes during pitch pre-processing;

quantizing the pitch gain of each of the subframes; and performing a delayed joint quantization of the fixed codebook gains for each of the subframes as a function of the stored quantized pitch gain of each of the subframes.

8. The method of claim 7, wherein the predicting and the representing are not performed when the first framing structure is selected.

9. The method of claim 7, wherein the predicting the fixed codebook characteristic comprises applying a third order moving average prediction.

10. The method of claim 7, wherein the prediction coefficients comprise a first subframe predictor coefficient represented as {0.6, 0.3, 0.1}, a second subframe predictor coefficient represented as {0.4, 0.25, 0.1}, and a third subframe predictor coefficient represented as {0.3, 0.015, 0.075}.

11. The method of claim 7, wherein the fixed codebook characteristic comprises fixed codebook energy.

12. The method of claim 7, wherein the first framing structure has a first bit allocation and the second framing structure has a second bit allocation, wherein the first bit allocation is different than the second bit allocation, and wherein each of the first bit allocation and the second bit allocation includes a bit allocation indicative of the selected framing structure.

13. A method of processing a speech signal, the method comprising:

selecting one of a first framing structure and a second framing structure for encoding parameters of a frame of the speech signal;

predicting a fixed codebook characteristic for each of a plurality of subframes when the second framing structure is selected, wherein the predicting is performed as a function of prediction coefficients associated with each subframe and a fixed codebook characteristic from each of plurality of subframes of a previous frame; and representing a fixed codebook gain for each of the subframe with respective predicted fixed codebook characteristic when the second framing structure is selected;

wherein the prediction coefficients comprise a first subframe predictor coefficient represented as {0.6, 0.3, 0.1}, a second subframe predictor coefficient represented as {0.4, 0.25, 0.1}, and a third subframe predictor coefficient represented as {0.3, 0.015, 0.075}.

14. The method of claim 13, wherein the predicting the fixed codebook characteristic comprises applying a third order moving average prediction.

15. The method of claim 13, wherein the fixed codebook characteristic comprises fixed codebook energy.

16. The method of claim 13, wherein the first framing structure has a first bit allocation and the second framing structure has a second bit allocation, wherein the first bit allocation is different than the second bit allocation, and wherein each of the first bit allocation and the second bit allocation includes a bit allocation indicative of the selected framing structure.

* * * * *